(12) United States Patent
Takahashi

(10) Patent No.: US 9,373,364 B2
(45) Date of Patent: Jun. 21, 2016

(54) SEMICONDUCTOR MEMORY AND METHOD OF OPERATING SEMICONDUCTOR MEMORY

(71) Applicant: Renesas Electronics Corporation, Kawasaki-shi, Kanagawa (JP)

(72) Inventor: Hiroyuki Takahashi, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 149 days.

(21) Appl. No.: 13/789,059

(22) Filed: Mar. 7, 2013

(65) Prior Publication Data

US 2013/0258789 A1  Oct. 3, 2013

(30) Foreign Application Priority Data

Mar. 30, 2012  (JP) .................................. 2012-079281

(51) Int. Cl.
 *G11C 11/413* (2006.01)
 *G11C 5/14* (2006.01)

(52) U.S. Cl.
 CPC .............. *G11C 5/147* (2013.01); *G11C 11/413* (2013.01)

(58) Field of Classification Search
 CPC .............. G11C 5/14; G11C 7/00; G11C 7/06; G11C 5/147; G11C 11/413
 USPC .................................... 365/203, 207, 189.09
 See application file for complete search history.

(56) References Cited

U.S. PATENT DOCUMENTS

| | | | | |
|---|---|---|---|---|
| 5,132,931 A * | 7/1992 | Koker | ........................ | 365/210.1 |
| 5,446,696 A * | 8/1995 | Ware et al. | .................... | 365/222 |
| 6,407,943 B1 * | 6/2002 | Choi et al. | .................... | 365/145 |
| 6,996,019 B2 * | 2/2006 | Song | ............................. | 365/205 |
| 7,095,665 B2 * | 8/2006 | Song | ............................. | 365/205 |
| 8,018,779 B2 | 9/2011 | Takahashi | | |
| 2002/0125938 A1 * | 9/2002 | Kim et al. | ..................... | 327/539 |
| 2002/0136075 A1 * | 9/2002 | Chen Hsu et al. | ............ | 365/222 |
| 2005/0128786 A1 * | 6/2005 | Ohtsuka et al. | ............... | 365/149 |
| 2006/0181946 A1 * | 8/2006 | Park et al. | ..................... | 365/210 |
| 2007/0047320 A1 * | 3/2007 | Kim et al. | ................ | 365/185.22 |
| 2008/0192536 A1 * | 8/2008 | Lee | ............................ | 365/185.2 |
| 2009/0046505 A1 * | 2/2009 | Lee et al. | ................... | 365/185.2 |
| 2010/0046306 A1 * | 2/2010 | Takahashi | ................ | 365/189.09 |
| 2011/0204873 A1 * | 8/2011 | Jeong | ........................... | 324/71.1 |
| 2012/0230103 A1 * | 9/2012 | Choe et al. | ................. | 365/185.2 |

FOREIGN PATENT DOCUMENTS

JP      2010-73299 A      4/2010

* cited by examiner

*Primary Examiner* — Huan Hoang
*Assistant Examiner* — Muna A Techane
(74) *Attorney, Agent, or Firm* — Foley & Lardner LLP

(57) ABSTRACT

Deterioration of holding characteristics due to fluctuations in power supply voltage VDD is prevented. During writing or reading in one of memory circuits, a pair of bit lines in the other memory circuit is controlled to a dummy-bit-line voltage ranging from a ground voltage to ½×VDD. In a subsequent precharge period, a pair of bit lines in one of the memory circuits and the pair of bit lines in the other memory circuit are coupled to a reference voltage generating circuit.

6 Claims, 14 Drawing Sheets

SEMICONDUCTOR MEMORY AND METHOD OF OPERATING SEMICONDUCTOR MEMORY

CROSS-REFERENCE TO RELATED APPLICATIONS

The disclosure of Japanese Patent Application No. 2012-079281 filed on Mar. 30, 2012 including the specifications, drawings and abstract is incorporated herein by reference in its entirety.

The present invention relates to a semiconductor memory and a method of operating the semiconductor memory.

BACKGROUND

Semiconductor memories such as a DRAM store data in memory cells. The memory cell includes an access transistor and a capacitor. The capacitor is coupled to one of paired bit lines via the access transistor. During writing of data, one of the bit lines is controlled to a high level (power supply voltage) while the other bit line is controlled to a low level (ground voltage). In this state, the access transistor is turned on and thus the memory cell holds a charge in the capacitor to store a logical value corresponding to the high level or the low level. During standby, a pair of bit lines is precharged to a reference voltage Vref. When data is read, a select transistor is turned on. The voltage of one of the bit lines slightly changes from the reference voltage Vref according to the charge held in the capacitor, resulting in a voltage difference between the paired bit lines. The generated voltage difference is amplified by a sense amplifier circuit and is read as output data by an external circuit.

In this case, ½ VDD (hereinafter, will be called HVDD) that is an intermediate voltage between a ground voltage GND and a power supply voltage VDD is generally used as the reference voltage Vref.

Improved cell holding characteristics are desirable for a semiconductor memory. It is known that the reference voltage Vref is set at a voltage lower than HVDD to improve the cell holding characteristics. Generally, an NMOS transistor acting as a switch circuit is provided between a memory cell and a pair of bit lines. In the case where high-level data is stored in the memory cell, the charge of the memory cell leaks to the back bias of the NMOS transistor, which may lose the charge of the memory cell. Consequently, the voltage of the bit line does not sufficiently increase during reading, so that a voltage difference between the paired bit lines is hardly amplified. In this case, the reference voltage Vref set at a low voltage leads to an increase in voltage difference between the reference voltage Vref and the voltage of the bit line. Thus, a reading margin can be increased.

In this respect, Japanese Unexamined Patent Publication No. 2010-73299 discloses a technique of improving data holding characteristics while preventing a reduction in the speed of a semiconductor device. A semiconductor memory described in Japanese Unexamined Patent Publication No. 2010-73299 will be described below.

FIG. 1 is a circuit diagram illustrating a semiconductor memory 100 described in Japanese Unexamined Patent Publication No. 2010-73299. The semiconductor memory 100 includes a reference voltage power supply circuit 102, a first memory circuit 101-1, and a second memory circuit 101-2. The reference voltage power supply circuit 102 supplies a reference voltage Vref to a reference voltage wiring 108.

The first memory circuit 101-1 includes pairs of bit lines (D11-DB11, D12-D812), sense amplifier circuits (103-1, 103-2), precharge circuits (104-1, 104-2), a pull-down circuit 105-1, and a plurality of memory cells (106-1, 106-2). The memory cell 106-1 is coupled to the bit line D11 via a switch circuit while the memory cell 106-2 is coupled to the bit line D12 via a switch circuit. These switch circuits are turned on when a word line WL0 is selected. The sense amplifier circuit 103-1 amplifies a voltage difference between the paired bit lines (D11-DB11) when a control signal SEC) is turned on. The sense amplifier circuit 103-2 amplifies a voltage difference between the paired bit lines (D12-DB12) when the control signal SE0 is turned on. The precharge circuit 104-1 couples the pair of bit lines (D11-DB11) to the reference voltage wiring 108 when a control signal PDL0G is turned on. The precharge circuit 104-2 couples the pair of bit lines (D12-DB12) to the reference voltage wiring 108 when a control signal PDL0 is turned on. The pull-down circuit 105-1 pulls down the pair of bit lines (D11-DB11) to a ground voltage GND when a control signal PGL0 is turned on. Moreover, a parasitic capacitance 107 occurs between the paired bit lines (D11-DB11, D12-DB12).

The second memory circuit 101-2 is identical in configuration to the first memory circuit 101-1. Specifically, the second memory circuit 101-2 includes pairs of bit lines (D22-DB22, D21-DB21), sense amplifier circuits (103-3, 103-4), precharge circuits (104-3, 104-4), a pull-down circuit 105-2, and a plurality of memory cells (106-3, 106-4). When a word line WL1 is selected, the memory cells 106 (106-3, 106-4) are coupled to the respective bit lines (D22, D21). The sense amplifier circuits (103-3, 103-4) are controlled by a control signal SEl. The precharge circuits (104-3, 104-4) are controlled by control signals (PDL1G, PDL1). The pull-down circuit 105-2 is controlled by a control signal PGL1.

A method of operating the semiconductor memory 100 will be described below. When the first memory circuit 101-1 is selected in the semiconductor memory 100, the second memory circuit 101-2 is controlled to an unselected state and is operated as a dummy memory circuit. Referring to FIGS. 2 and 3, a data reading operation in the first memory circuit 101-1 will be described below. FIGS. 2 and 3 are timing charts showing the method of operating the semiconductor memory 100. FIG. 2 shows the waveforms of the signals. FIG. 3 shows the voltages of the bit lines (D11, D12, D21, D22, DB11, DB12, DB21, DB22).

As shown in FIG. 2, in a standby period before reading (before time t1), the control signals (PDL0, PDL0G, PDL1, PDL1G) are high-level signals. Thus, the precharge circuits 104 (104-1 to 104-4) are turned on in the memory circuits (101-1, 101-2). In other words, all the bit lines (D11, D12, D21, D22, DB11, DB12, DB21, DB22) are coupled to the reference voltage wiring 108. This allows precharging of the bit lines to the reference voltage Vref (FIG. 3).

As shown in FIG. 2, the control signals (PDL0, PDL0G, PDL1G) are switched to a low level at time t1 during reading. Thus, the precharging of the paired bit lines (D11-DB11, D12-DB12, D22-DB22) is reset.

At time t2, the word line WL0 is turned on. Specifically, the word line WL0 in the first memory circuit 101-1 is selected. In the first memory circuit 101-1, the memory cells (106-1 and 106-2) are coupled to the respective bit lines (D11, D12). It is assumed that high-level data is stored in the memory cells 106-1 and 106-2. In this case, as shown in FIG. 3, the voltages of the bit lines (D11, D12) slightly rise from the reference voltage Vref. As shown in FIG. 2, at time t2, the control signal PGL1 is switched to a high level. Thus, in the second memory circuit 101-2, the pull-down circuit 105-2 is operated to pull down the pair of bit lines D22 and DB22 to the ground voltage GND.

At time t3, the control signal SE0 is controlled to a high level. Thus, in the first memory circuit 101-1, the sense amplifier circuits 103-1 and 103-2 are operated to amplify a voltage difference between the paired bit lines (011-D811, D12-0312). Specifically, as shown in FIG. 3, the voltages of the bit lines D11 and D12 are raised to a power supply voltage VDD while the voltages of the bit lines DB11 and DB12 are reduced to the ground voltage GND. In this state, the amplified voltage difference is read as output data to an external circuit (not shown).

After the completion of reading, as shown in FIG. 2, the word line WL0 is turned off and the control signals SE0 and PGL1 are changed to a low level at time t4. At time t5, the control signals PDL0, PDL0G, and PDL1G are turned on. Thus, the pairs of bit lines (D11-DB11, D12-DB12, D22-DB22, D21-DB21) are all electrically coupled via the reference voltage wiring 108. This allows charge sharing among the pairs of bit lines. Before the charge sharing, the voltages of the bit lines D11 and D12 are equal to the power supply voltage VDD while the voltages of the bit lines (DB11, DB12, D22, DB22) are equal to the ground voltage CND. Thus, as a result of the charge sharing, as shown in FIG. 3, the voltages of the bit lines are averaged into ⅓ VDD (reference voltage Vref). The reference voltage power supply circuit 102 generates ⅓ VDD as the reference voltage Vref. In other words, the voltages of the bit lines D21 and DB21 are equal to the reference voltage Vref that does not affect the charge sharing. The reference voltage Vref, which is a voltage obtained after the charge sharing, can be controlled by changing the number of bit lines coupled to the reference voltage wirings 108 during the charge sharing.

In the semiconductor memory 100, the reference voltage Vref can be set at a voltage lower than ½ VDD. When the first memory circuit 100-1 is selected, the second memory circuit 100-2 is set to be unselected. Thus, in a reading period of the first memory circuit 100-1, the voltage of the pair of bit lines (D22-DB22) in the second memory circuit 100-2 can be pulled down. The pull-down may be called a setup for charge sharing. A setup can be performed during reading of data in the first memory circuit 100-1, enabling a high-speed circuit operation.

SUMMARY

In the semiconductor memory 100, the reference voltage Vref can be set lower than ½ VDD.

Typically, the power supply voltage VDD of the semiconductor memory has an operating range (VDDmin to VDDmax). FIG. 4 shows a graph of the relationship among the power supply voltage VDD, the reference voltage Vref, and a dummy bit-line level DBL. The dummy bit-line level DBL is the voltage of the pair of bit lines (D22-DB22) of the second memory circuit 100-2 before charge sharing. In the semiconductor memory 100, the pair of bit lines (D22-DB22) is pulled down to the ground voltage GND. In other words, the dummy bit-line level DBL is the ground voltage GND. Hence, the reference voltage Vref generated by charge sharing has a certain ratio (e.g., ⅓ VDD) relative to the power supply voltage VDD. In other words, the higher the power supply voltage VDD, the higher the reference voltage Vref, whereas the lower the power supply voltage VDD, the lower the reference voltage Vref.

The reference voltage Vref is set at ½ VDD or lower, thereby improving cell holding characteristics. However, the reference voltage Vref decreases with a reduction of the power supply voltage VDD, and thus in the case where low level data is stored in the memory cell, the operating margin of the sense amplifier may decrease, resulting in inconstant sensing.

In the semiconductor memory 100, the pair of bit lines D22 and DB22 in the unselected memory circuit 101-2 is set at a ground voltage and a charge is shared between the bit lines by precharging, thereby generating the reference voltage Vref lower than ½ VDD. However, the pair of bit lines in the unselected memory circuit is set at the ground voltage GND, deteriorating the digit disturb hold (DDH) characteristics of the unselected memory cell coupled to the pair of bit lines D22 and DB22.

In other words, unfortunately, the holding characteristics of the semiconductor memory 100 may deteriorate with fluctuations in the power supply voltage VDD.

A semiconductor memory according to the present invention includes a reference voltage control circuit containing a reference voltage generating circuit that generates a reference voltage, a first memory circuit and a second memory circuit. The first memory circuit includes: a first memory cell coupled to a first word line; a first bit line pair where data stored in the first memory cell is read; a first precharge circuit that couples the reference voltage generating circuit with the first bit line pair to precharge the first bit line pair to the reference voltage; a first equalizer circuit that equalizes the first bit line pair; and a first sense amplifier that is coupled to the first bit line pair to amplify a voltage difference of the first bit line pair during activation. The second memory circuit includes: a second memory cell coupled to a second word line; a second bit line pair where data stored in the second memory cell is read; a second precharge circuit that couples the reference voltage generating circuit with the second bit line pair to precharge the second bit line pair to the reference voltage; a second equalizer circuit that equalizes the second bit line pair; and a second sense amplifier that is coupled to the second bit line pair to amplify a voltage difference of the second bit line pair during activation. The second bit line pair is set at a dummy-bit-line voltage ranging from a ground voltage to ½×VDD in a reading/writing period during which the first memory circuit is selected and the second memory circuit is unselected. The first and second precharge circuits couple the first and second bit line pairs to the reference voltage generating circuit in a precharge period after the reading/writing period.

A method of operating the semiconductor memory according to the present invention is a method of operating a semiconductor memory including: a reference voltage control circuit containing a reference voltage generating circuit that generates a reference voltage; a first memory circuit; and a second memory circuit. The first memory circuit includes: a first memory cell coupled to a first word line; a first bit line pair where data stored in the first memory cell is read; a first precharge circuit that couples the reference voltage generating circuit with the first bit line pair to precharge the first bit line pair to the reference voltage; a first equalizer circuit that equalizes the first bit line pair; and a first sense amplifier that is coupled to the first bit line pair to amplify a voltage difference of the first bit line pair during activation. The second memory circuit includes: a second memory cell coupled to a second word line; a second bit line pair where data stored in the second memory cell is read; a second precharge circuit that couples the reference voltage generating circuit with the second bit line pair to precharge the second bit line pair to the reference voltage; a second equalizer circuit that equalizes the second bit line pair; and a second sense amplifier that is coupled to the second bit line pair to amplify a voltage difference of the second bit line pair during activation. A method of operating the semiconductor memory includes the steps of:

controlling the second bit line pair to a dummy-bit-line voltage ranging from the ground voltage to ½×VDD in a reading/writing period during which the first memory circuit is selected and the second memory circuit is unselected; and coupling the first and second bit line pairs to the reference voltage generating circuit via the first and second precharge circuits in a precharge period after the reading/writing period.

The present invention provides a semiconductor memory and a method of operating the semiconductor memory which can prevent deterioration of holding characteristics in the case where a power supply voltage VDD fluctuates.

DETAILED DESCRIPTION

Outline

Figure 5:
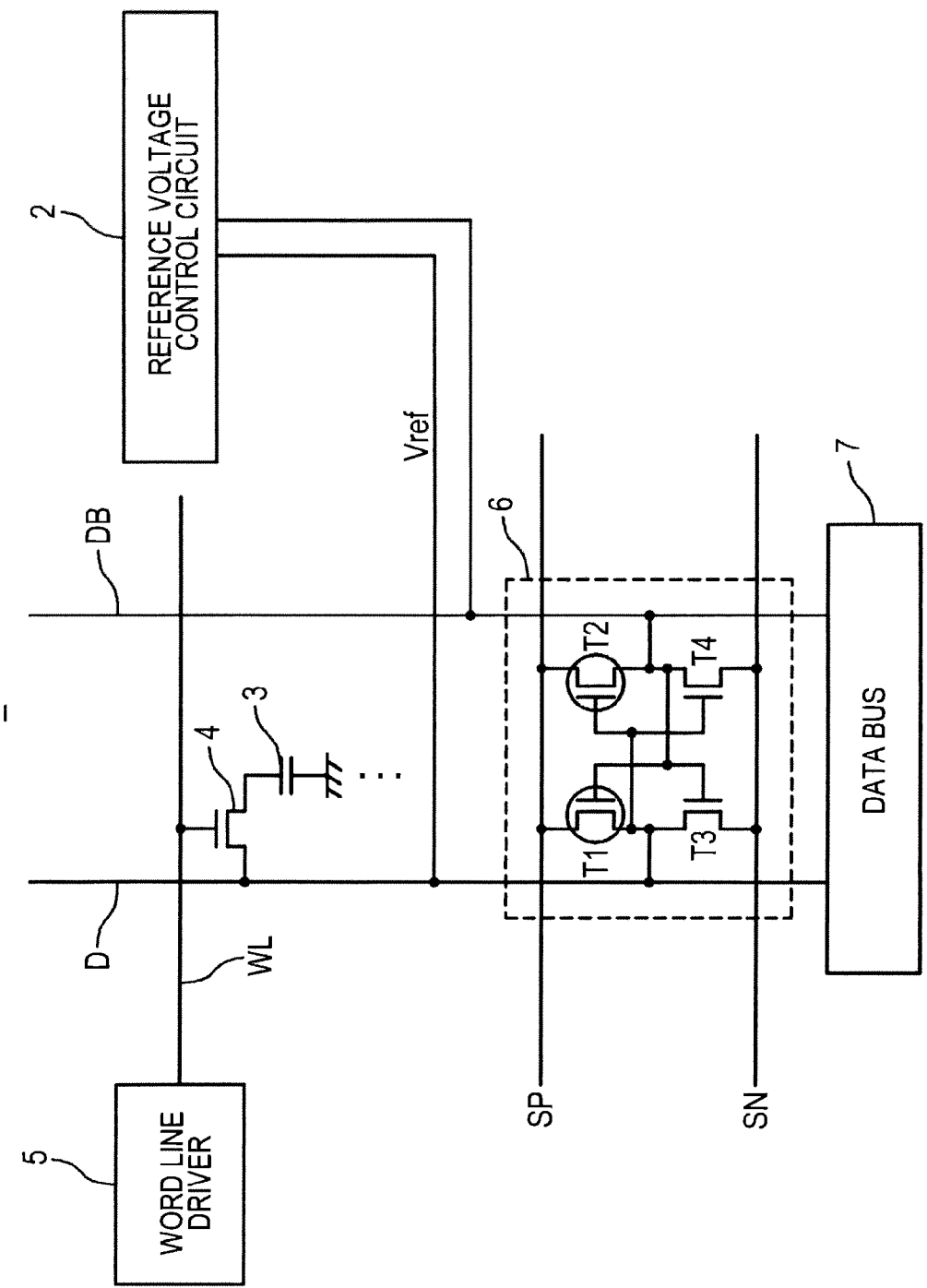
FIG. 5 is a circuit diagram schematically illustrating the semiconductor memory according to the present invention.

The outline of the present invention will be described below. FIG. 5 is a circuit diagram schematically illustrating a semiconductor memory 1 according to the present invention.

As illustrated in FIG. 5, the semiconductor memory 1 includes a reference voltage control circuit 2, a pair of bit lines (D, DB), a memory cell 3, a word line driver 5, a sense amplifier circuit 6, a word line WL, and a data bus 7. The memory cell 3 includes a capacitor and an access transistor 4. One end of the memory cell is grounded while the other end of the memory cell is coupled to the bit line D via the access transistor 4. An actual configuration includes a plurality of word lines WL, a plurality of pairs of bit lines, and a plurality of memory cells 3 for the respective word lines WL and the respective pairs of bit lines.

The word line driver 5 has the function of selecting one of the word lines WL in response to an address signal (not shown). When one of the word lines WL is selected, the corresponding access transistor 4 is turned on and the memory cell 3 is electrically coupled to one of the bit lines (D, DB).

The data bus 7 is a part for data reading/writing. The pair of bit lines (D, DB) is coupled to the data bus 7.

The sense amplifier circuit 6 is provided to amplify a voltage difference between the paired bit lines (D, DB). The sense amplifier circuit 6 includes a pair of PMOS transistors (T1, T2) and a pair of NMOS transistors (T3, T4). The common source of the pair of PMOS transistors (T1, T2) is coupled to a wiring fed with a control signal SP. The common source of the pair of NMOS transistors (T3, T4) is coupled to a wiring fed with a control signal SN. The transistors T1 and T3 are coupled in series. The transistors T2 and T4 are also coupled in series. The gates of the transistors T1 and T3 are coupled to a node between the transistor T2 and the transistor T4. The gates of the transistors T2 and T4 are coupled to a node between the transistor T1 and the transistor T3. The node between the transistor T1 and the transistor T3 is coupled to the bit line D. The node between the transistor T2 and the transistor T4 is coupled to the bit line DB. The sense amplifier circuit 6 is fed with a high level signal serving as the control signal SP and a low-level signal serving as the control signal SN. At this point, the sense amplifier circuit 6 amplifies a voltage difference between the paired bit lines D and DB. The pair of NMOS transistors (T3, T4) has a gate threshold voltage VTN.

The reference voltage control circuit 2 outputs Vref as a reference voltage and supplies the reference voltage Vref to the pair of bit lines (D, DB).

When data is written in the semiconductor memory 1, one of the bit lines (D, DB) is set at a high level (power supply voltage VDD) and the other hit line (D, DB) is set at a low level (ground voltage CND) through the data bus 7. The word line driver 5 then selects the word line WL. Thus, the access transistor 4 is turned on to electrically couple the memory cell 3 and the bit line D. When the bit line D has a high level voltage, high level data is written in the memory cell 3. When the bit line D has low level voltage, low level data is written in the memory cell 3.

After the data is written, the pair of bit lines D and DB is precharged to the reference voltage Vref. When data is read, precharging of the pair of bit lines (D, DB) is reset, and then the word line driver 5 selects the word line WL to be read. Thus, the memory cell 3 is coupled to the bit line D. When the memory cell 3 stores high level data, the voltage of the bit line D slightly increases. When the memory cell 3 stores low level data, the voltage of the bit line D slightly decreases. Subsequently, a high level signal is supplied as the control signal SP while low level signal is supplied as the control signal SN. Hence, the sense amplifier circuit 6 is operated to amplify a voltage difference between the paired bit lines D and DB. The amplified voltage difference is read by an external circuit (not shown) through the data bus 7.

Figure 6:
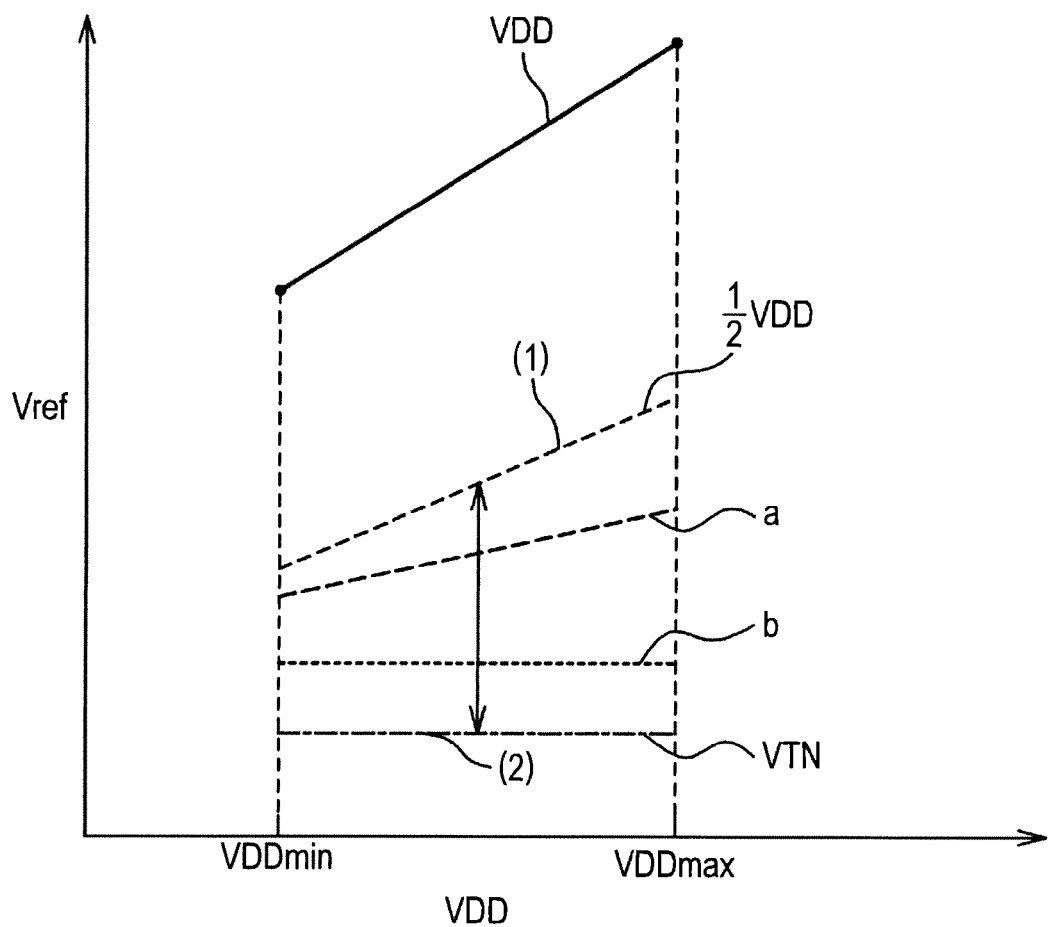
FIG. 6 is a graph showing the relationship between the reference voltage Vref and the power supply voltage VDD.

In a standby period (after a data writing period and a data reading period), the reference voltage control circuit 2 controls the voltage of the pair of bit lines (D, DB) to the reference voltage Vref. FIG. 6 is a graph showing the relationship between the reference voltage Vref and the power supply voltage VDD. The horizontal axis shows the power supply voltage VDD while the vertical axis shows a voltage. FIG. 6 shows straight lines (1) and (2). The straight lines (1) and (2) are expressed by equation (1) below.

$$V\text{ref}=a\times VDD+b(a<\tfrac{1}{2}, b>0) \quad \text{(Equation 1)}$$

The reference voltage control circuit 2 controls the voltage of the pair of bit lines (D, DB) such that the reference voltage Vref is expressed by equation (1). The reference voltage Vref controlled thus prevents the value of the reference voltage Vref from increasing more than necessary when the power supply voltage VDD is high. Also, when the power supply voltage VDD is low, the reference voltage Vref can prevent the value of the reference voltage Vref from decreasing more than necessary. In other words, deterioration of cell hold characteristics can be prevented when the power supply voltage VDD fluctuates.

The present invention will be specifically described below with reference to embodiments of the present invention.

First Embodiment

Figure 7:
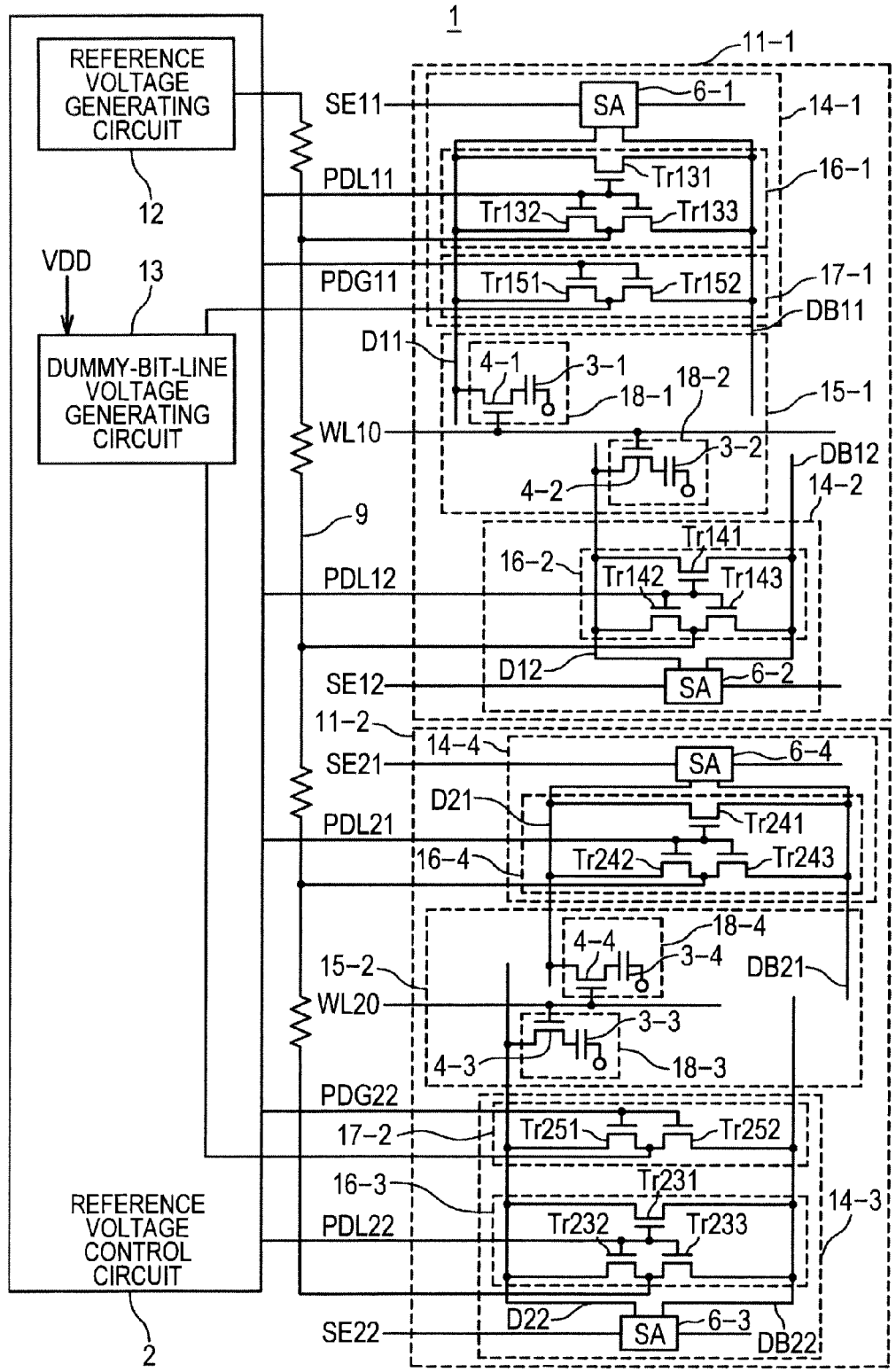
FIG. 7 is a schematic diagram illustrating a semiconductor memory according to a first embodiment.

FIG. 7 is a schematic diagram illustrating a semiconductor memory 1 according to the present embodiment. As illustrated in FIG. 7, the semiconductor memory 1 according to the present embodiment includes a reference voltage control circuit 2, a first memory circuit 11-1, and a second memory circuit 11-2.

Figure 1:
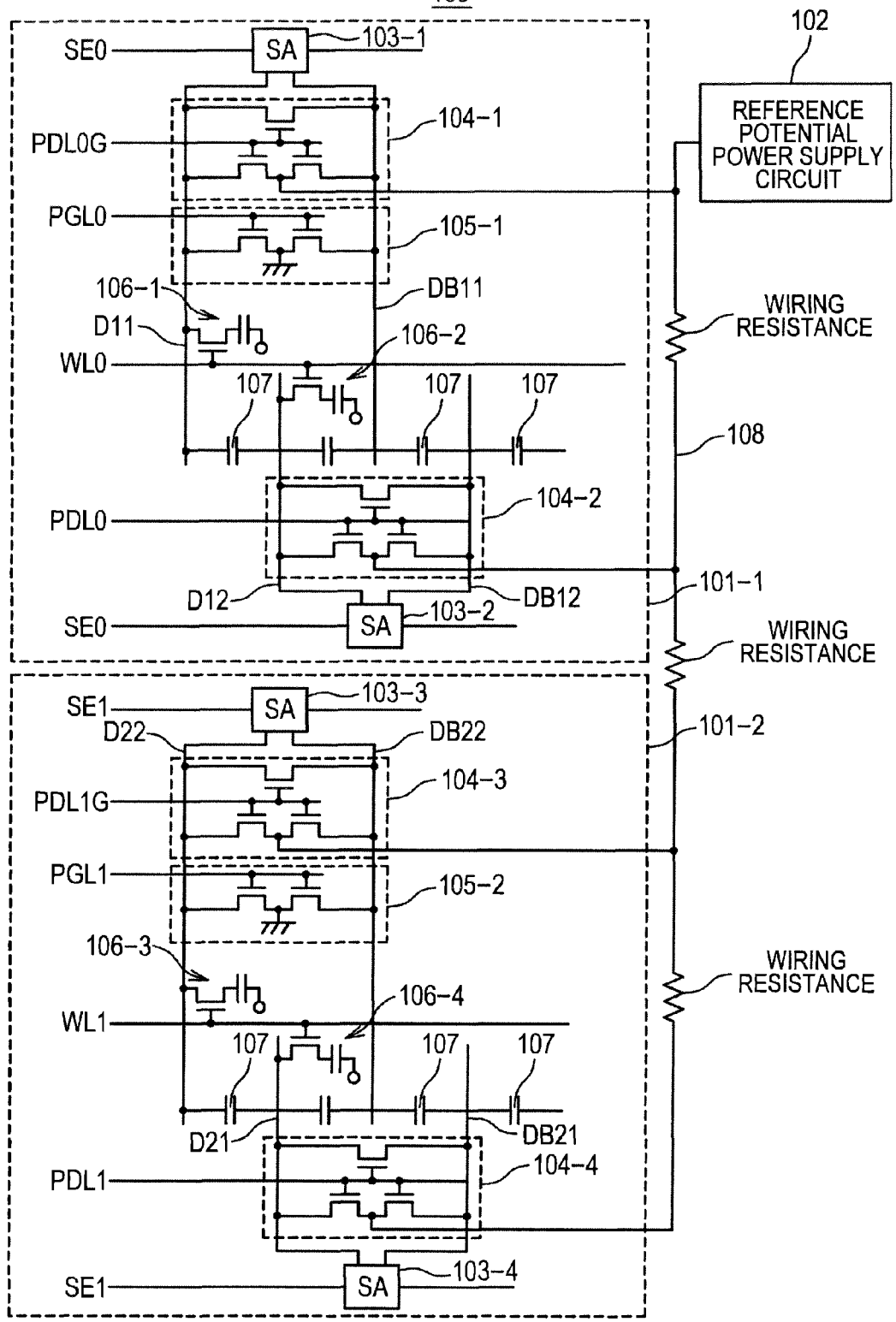
FIG. 1 is a circuit diagram illustrating a semiconductor memory described in Japanese Unexamined Patent Publication No. 2010-73299.
Figure 2:
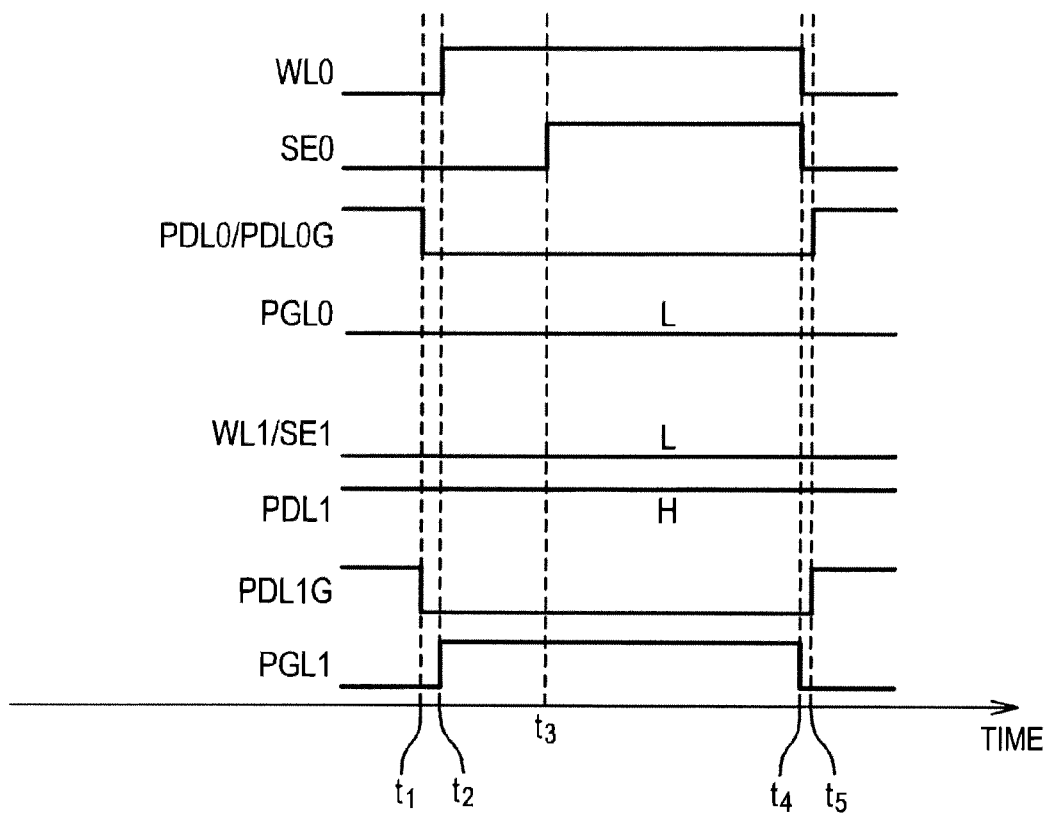
FIG. 2 is a timing chart showing a method of operating the semiconductor memory.
Figure 3:
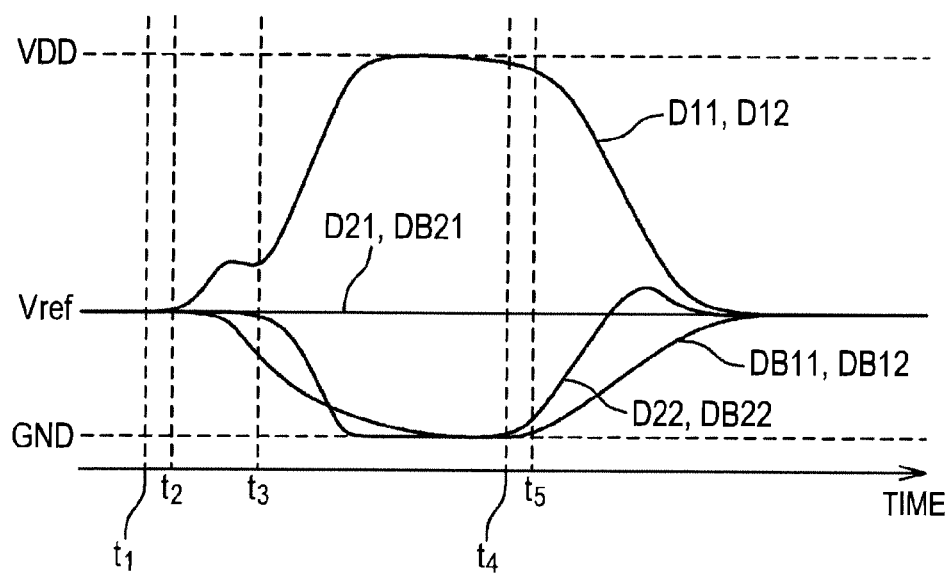
FIG. 3 is a timing chart showing the method of operating the semiconductor memory.
Figure 4:
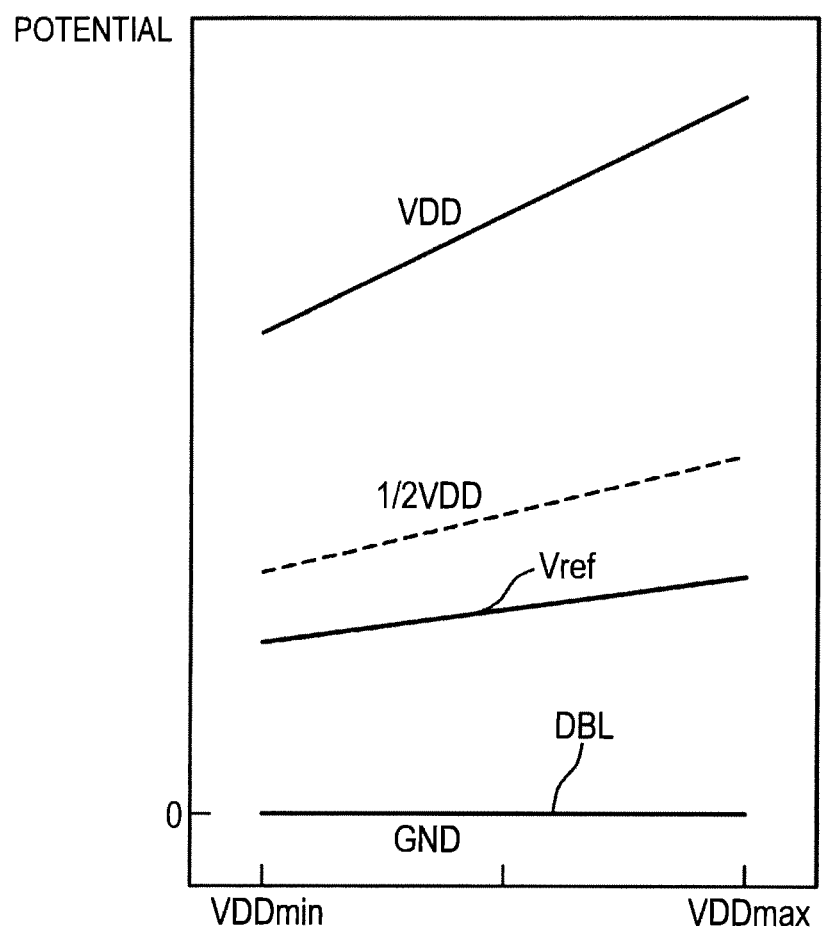
FIG. 4 is a graph showing the relationship among a power supply voltage VDD, a reference voltage Vref, and a dummy bit-line level DBL.

The semiconductor memory 1 according to the present embodiment is different from the semiconductor memory 100 in FIG. 1 as will be described below. In the semiconductor memory 100 illustrated in FIG. 1, the memory circuits 101-1 and 101-2 include the respective pull-down circuits (105-1, 105-2). When data is read in the memory circuit 101-1, the pull-down circuit 105 is operated in the memory circuit 101-2 to pull down the pair of bit lines (D22-DB22) to the ground voltage GND, whereas in the present embodiment, dummy-bit-line level switching circuits 17 (17-1, 17-2) are provided instead of the pull-down circuit 105. The reference voltage control circuit 2 includes a dummy-bit-line voltage generating circuit 13 that generates a dummy-bit-line voltage DBL. When data is read in one of the memory circuits (first memory circuit 11-1), the dummy-bit-line level switching circuit 17-2 is turned on in the other memory circuit (second memory circuit 11-2) to control the voltages of the paired bit lines D22 and DB22 to the dummy-bit-line voltage DBL. In this case, the dummy-bit-line voltage generating circuit 13 determines the dummy-bit-line voltage DBL based on the power supply voltage VDD. As in the semiconductor memory 100 in FIG. 1, a charge is shared among pairs of bit lines (D11-DB11, D12-DB12, D22-DB22, D21-DB21). After the charge sharing, the voltages of the paired bit lines (D11-DB11, D12-0012, D22-DB22, D21-DB21) depend on the dummy-bit-line voltage DBL applied to the pair of bit lines 922 and DB22. In other words, the dummy-bit-line voltage generating circuit 13 controls the dummy-bit-line voltage DBL so as to control the voltages of the paired bit lines after the charge sharing. Specifically, after the charge sharing, the voltage of the bit line can be set at a proper value equal to or lower than ½ VDD according to a power supply voltage VDD, thereby preventing deterioration of cell holding characteristics even if the power supply voltage VDD fluctuates. Other points are similar to those of the semiconductor memory 100 in FIG. 1.

The semiconductor memory 1 according to the present embodiment will be specifically described below.

As described above, the reference voltage control circuit 2 is a circuit for controlling the reference voltage Vref. The reference voltage control circuit 2 includes a reference voltage generating circuit 12 and the dummy-bit-line voltage generating circuit 13. The reference voltage generating circuit 12 is coupled to the reference voltage wiring 9 to supply the reference voltage Vref to the reference voltage wiring 9. The voltage of the bit line is set by Vref supplied from the reference voltage generating circuit after the charge sharing. At this point, the reference voltage Vref is generated as high as the voltage of the bit line after the charge sharing. The dummy-bit-line voltage generating circuit 13 has the function of determining the voltage of the dummy-bit-line voltage DBL based on the voltage of the power supply voltage VDD, and generating the dummy-bit-line voltage DBL.

The configuration of the first memory circuit 11-1 will be described below.

The first memory circuit 11-1 includes the pairs (two pairs in the present embodiment) of bit lines (D11-DB11, D12-DB12), a cell plate 15-1, and a sense amplifier areas (14-1, 14-2).

The cell plate 15-1 includes a plurality of memory cells (18-1, 18-2). The memory cell 18-1 includes a capacitor 3-1 and an access transistor 4-1. The capacitor 3-1 is coupled to the bit line D11 via the access transistor 4-1. The access transistor 4-1 is implemented by an NMOS transistor whose gate is coupled to a word line WL10. The memory cell 18-2 includes a capacitor 3-2 and an access transistor 4-2. The memory cell 3-2 is coupled to the bit line D12 via the access transistor 4-2. The access transistor 4-2 is implemented by an NMOS transistor whose gate is coupled to the word line WL10.

The cell plate 15-1 includes a plurality of word lines WL10 (not shown). The memory cells 18 are provided for the respective word lines WL10. Upon selection (reading or writing), one of the word lines WL10 is selected and then the capacitor 3 is coupled to the bit line in the memory cell 18 corresponding to the selected word line WL10.

The sense amplifier area 14-1 is a part for controlling the voltage of the pair of bit lines (D11-DB11). The sense amplifier area 14-1 includes a sense amplifier circuit 6-1, a precharge circuit 16-1, and a dummy-bit-line level switching circuit 17-1.

The sense amplifier circuit 6-1 amplifies a voltage difference between the paired bit lines (D11-DB11). The operation of the sense amplifier circuit 6-1 is controlled by a control signal SE11. When the control signal 5E11 is activated (e.g., to a high level), the sense amplifier circuit 6-1 amplifies a voltage difference between the paired bit lines (D11-DB11).

The precharge circuit 16-1 switches electrical coupling between the pair of bit lines (D11-DB11) and the reference voltage wiring 9. The precharge circuit 16-1 is controlled by a control signal PDL11. When the control signal PDL11 is activated, the precharge circuit 16-1 short-circuits the pair of bit lines (D11-DB11) and is electrically coupled to the reference voltage wiring 9. Specifically, the precharge circuit 16-1 includes transistors Tr131, Tr132, and Tr133. The transistor Tr131 is coupled between the bit line D11 and the bit line DB11. The transistor Tr132 is coupled between the bit line D11 and the reference voltage wiring 9. The transistor Tr133 is coupled between the bit line DB11 and the reference voltage wiring 9. The gates of the transistors Tr131, Tr132, and Tr133 are fed with the control signal PDL11 from the reference voltage control circuit 2.

The dummy-bit-line level switching circuit 17-1 switches electrical coupling between the pair of bit lines (D11-DB11) and the dummy-bit-line voltage generating circuit 13. The dummy-bit-line level switching circuit 17-1 is controlled by a control signal PDG11. When the control signal PDG11 is activated, the dummy-bit-line level switching circuit 17-1 couples the pair of bit lines (D11-DB11) to the dummy-bit-line voltage generating circuit 13. Thus, the voltage of the pair of bit lines (D11-DB11) is controlled to the dummy-bit-line voltage DBL. Specifically, the dummy-bit-line level switching circuit 17-1 includes transistors Tr151 and Tr152. The transistor Tr151 is coupled between the bit line D11 and the dummy-bit-line voltage generating circuit 13. The transistor Tr152 is coupled between the bit line DB11 and the dummy-bit-line voltage generating circuit 13. The gates of the transistors Tr151 and Tr152 are fed with the control signal PDG11 from the reference voltage control circuit 2.

The sense amplifier area 14-2 is a part for controlling the voltage of the pair of bit lines (D12-DB12). The sense amplifier area 14-2 includes a sense amplifier circuit 6-2 and a precharge circuit 16-2 as in the sense amplifier area 14-1. The sense amplifier area 4-2 does not include the dummy-bit-line level switching circuit 17. The sense amplifier circuit 6-2 is provided to amplify a voltage difference between the paired bit lines (D12-DB12) and is controlled by a control signal SE12. The precharge circuit 16-2 includes transistors Tr141, Tr142, and Tr143 and is controlled by a control signal PDL12. In other words, when the control signal PDL12 is activated, the precharge circuit 16-2 short-circuits the bit line D12 and the bit line DB12 and is coupled to the reference voltage wiring 9.

The second memory circuit 11-2 will be described below. The second memory circuit 11-2 is identical in configuration to the first memory circuit 11-1. Specifically, the second memory circuit 11-2 includes a plurality of pairs (two pairs) of bit lines (D21-DB21, D22-DB22), a cell plate 15-2, and sense amplifier areas (14-3, 14-4).

The cell plate 15-2 includes a word line WL20 and memory cells (18-3, 18-4). The memory cells (18-3, 18-4) include capacitors (3-3, 3-4) and access transistors (4-3, 4-4).

The sense amplifier area 14-3 is provided for the pair of bit lines (D22-DB22) and includes a sense amplifier circuit 6-3, a precharge circuit 16-3, and a dummy-bit-line level switching circuit 17-2. The sense amplifier circuit 6-3 is controlled by a control signal SE22. The precharge circuit 16-3 includes transistor Tr231, Tr232, and Tr233 and is controlled by a control signal PDL22. The dummy-bit-line level switching circuit 17-2 includes transistors Tr251 and Tr252 and is controlled by a control signal PDG22.

The sense amplifier area 14-4 is provided for the pair of bit lines (D21-DB21) and includes a sense amplifier circuit 6-4 and a precharge circuit 16-4. The sense amplifier circuit 6-4 is controlled by a control signal SE21. The precharge circuit 16-4 includes transistors Tr241, Tr242, and Tr243 and is controlled by a control signal PDL21. The sense amplifier area 14-4 does not include the dummy-bit-line level switching circuit 17.

A method of operating the semiconductor memory 1 according to the present embodiment will be described below. In the present embodiment, when the first memory circuit 11-1 is selected, the second memory circuit 11-2 is unselected.

Figure 8:
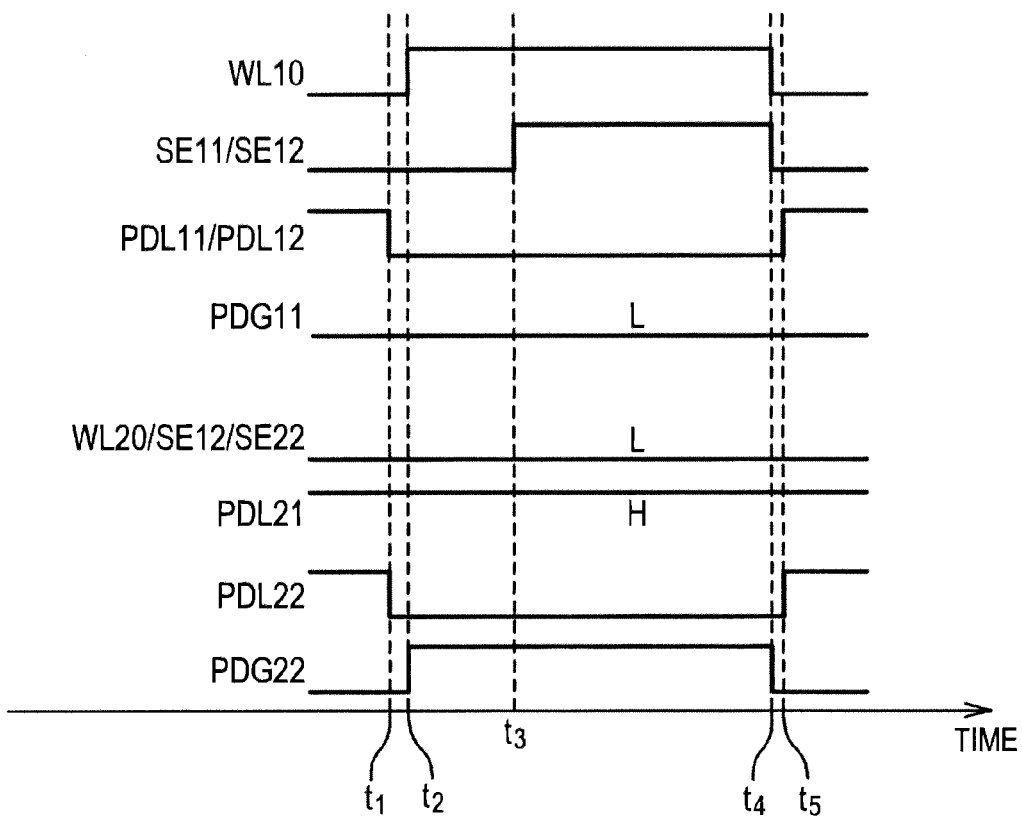
FIG. 8 is a timing chart showing a data reading operation.
Figure 9:
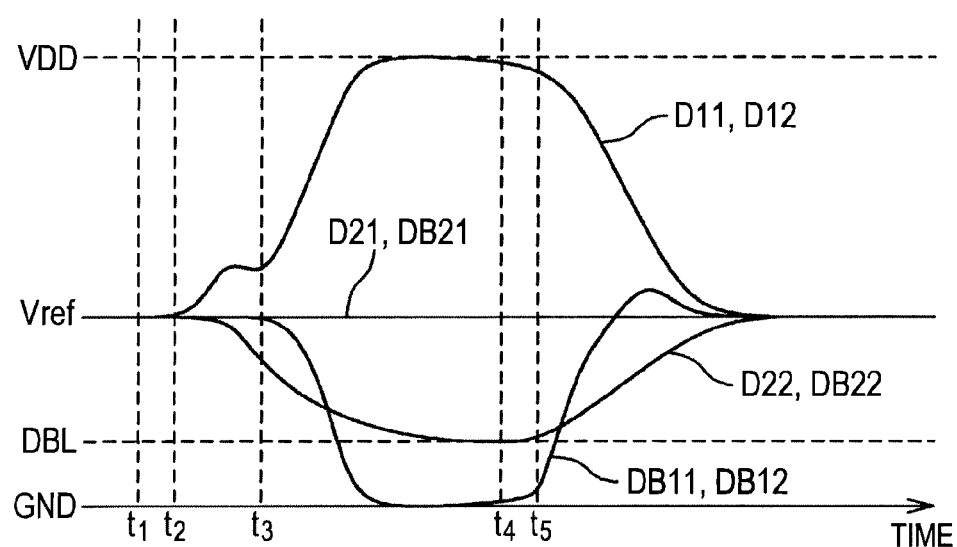
FIG. 9 is a graph showing bit line voltages.

FIG. 8 is a timing chart showing a data reading operation in the first memory circuit 11-1. It is assumed that high level data is stored in the memory cell 18-1 and the memory cell 18-2 in the first memory circuit 11-1. FIG. 8 shows the waveforms of the word line WL10, the control signals SE11/SE12, the control signals PDL11/PDL12, the control signal PDG11, the word line WL20, the control signals SE12/SE22, the control signal PDL21, the control signal PDL22, and the control signal PDG22. FIG. 9 is a graph showing the voltages of the bit lines (D11, D12, D21, D22, DB11, DB12, DB21, DB22).

In FIGS. 8 and 9, a period before time t1 is a standby period, a period from time t1 to t4 is a reading period of the first memory circuit 11-1, and a period after time t4 is a standby period.

Before time t1, the control signals PDL11, PDL12, PDL21, and PDL22 supplied to the reference voltage control circuit 2 are high level signals. Thus, the precharge circuit 16 (16-1, 16-4) performs a precharging operation and an equalizing operation in the memory circuit 11 (11-1, 11-2). Consequently, all the bit lines (D11, D12, D21, D22, DB11, DB12, DB21, and DB22) are coupled to the reference voltage wiring 9. In other words, in the standby period, the voltages of the bit lines (D11, D12, D21, D22, DB11, DB12, DB21, and DB22) are equal to the reference voltage Vref generated by the reference voltage generating circuit 12.

As shown in FIG. 8, the control signals PDL11 and PDL12 are switched to a low level at time t1. The control signal PDL22 is also switched to a low level. Thus, the precharged state of the paired bit lines D11-DB11 and D12-DB12 is reset in the selected first memory circuit 11-1 while the precharged state of the paired bit lines D22-DB22 is reset in the unselected second memory circuit 11-2. On the pair of bit lines D21-DB21, however, the control signal PDL21 is unchanged in a precharged state.

At time t2, the word line WL10 is selected in the first memory circuit 11-1. In other words, a high level signal is supplied to the word line WL10. Thus, in the first memory circuit 11-1, the capacitor 3-1 is electrically coupled to the bit line D11 while the capacitor 3-2 is electrically coupled to the bit line D12. As described above, high level data is stored in the capacitor 3-1 and the capacitor 3-2. Thus, as shown in FIG. 9, the voltages of the bit lines D11 and D12 slightly increase from the reference voltage Vref.

At time t2, as shown in FIG. 8, the control signal PDG22 is switched to a high level, so that in the second memory circuit 11-2, the pair of bit lines D22-DB22 is electrically coupled to the dummy-bit-line voltage generating circuit 13 via the dummy-bit-line level switching circuit 17-2. Hence, as shown in FIG. 9, the potential of the pair of bit lines D22-DB22 changes to the dummy-bit-line voltage DBL.

As shown in FIG. 8, at time t3, the control signals SE11 and SE12 are switched to a high level. Thus, the sense amplifier circuits 6 (6-1, 6-2) are activated in the first memory circuit 11-1. In other words, the sense amplifier circuit 6-1 amplifies a voltage difference between the paired bit lines D11-DB11 while the sense amplifier circuit 6-2 amplifies a voltage difference between the pair of bit lines D12-DB12. Thus, as shown in FIG. 9, the voltages of the bit lines D11 and D12 are raised to the power supply voltage VDD while the voltages of the bit lines DB11 and DB12 are lowered to a ground voltage GND. The amplified voltage difference is read through a data bus (not shown).

As shown in FIG. 8, at time t4, the signals supplied to the word line WL10, that is, the control signals SE11 and SE12 and the control signal PDG22 are switched to a low level. Then, at time t5, the control signals PDL11, PDL12, and PDL22 are switched to the high level. The precharge circuits 16-1, 16-2, and 16-3 perform a procharging operation and an equalizing operation. Thus, the pairs of bit lines D11-DE11, D12-DB12, and D22-DB22 are electrically coupled via the reference voltage wiring 9. This allows charge sharing among the bit lines D11 DB11, D12-DB12, and D22-DB22, averaging the voltages of the bit lines D11-DB11, D12-DB12, and D22-DB22 to, for example, ⅓ VDD+⅓ DEL (DEL: dummy-bit-line voltage). The bit lines (D21-DB21) having the reference voltage Vref before the charge sharing do not affect the charge sharing. Thus, the reference voltage Vref supplied from the reference voltage generating circuit is set at a voltage obtained by the charge sharing, so that the bit line (D21-DB21) hardly affects the charge sharing and the voltage does not fluctuate.

As described above, the voltage of the pair of bit lines after the charge sharing is determined by the voltages of the pairs of bit lines (D11-DB11, D12-DB12, D22-DB22) before the charge sharing. Thus, the voltage of the pair of bit lines after the charge sharing is determined by the voltage of the dummy-bit-line voltage DBL, that is, the voltage of the pair of bit lines (D22-DB22). In the present embodiment, the dummy-bit-line voltage generating circuit 13 (FIG. 7) can change the voltage of the dummy-bit-line voltage DBL according to the power supply voltage VDD, thereby properly setting the voltage of the pair of bit lines after the charge sharing.

Figure 10:
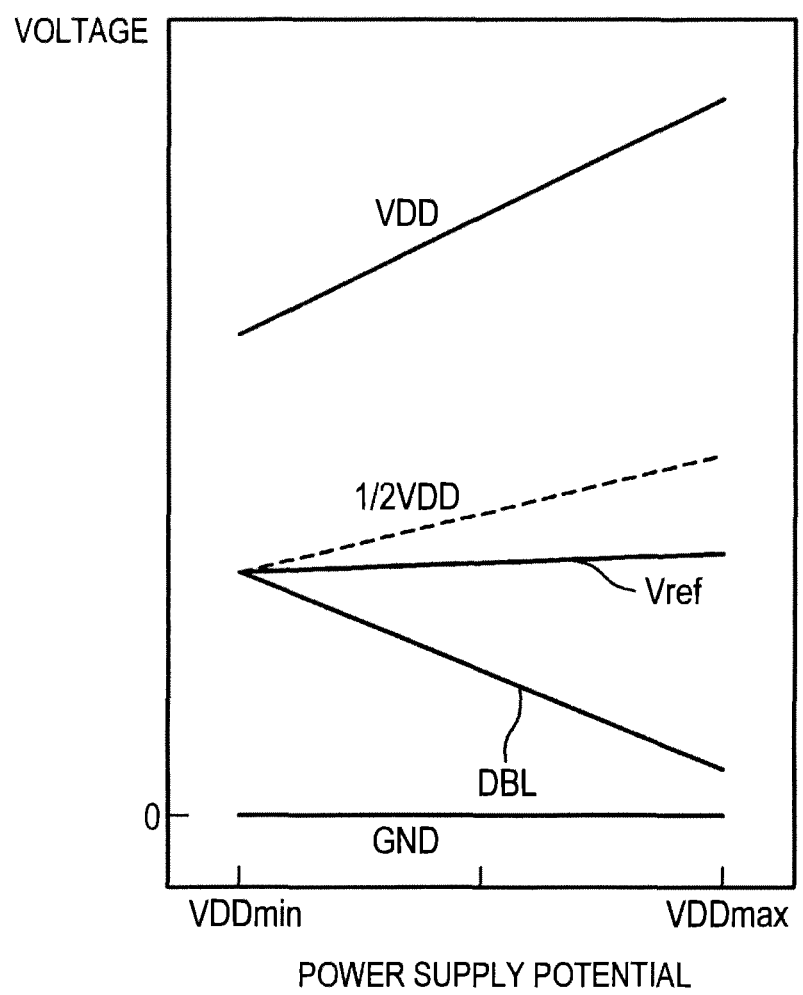
FIG. 10 is a graph showing the relationship among a power supply voltage VDD, a dummy-bit-line voltage DBL, and a reference voltage Vref.

FIG. 10 is a graph showing the relationship among the power supply voltage VDD, the dummy-bit-line voltage DBL, and the reference voltage Vref. As shown in FIG. 10, the dummy-bit-line voltage generating circuit 13 determines the voltage of the dummy-bit-line voltage DBL such that the lower the power supply voltage VDD, the higher the dummy-bit-line voltage DBL and vice versa.

Hence, in the case where the power supply voltage VDD increases, the reference voltage Vref can be set at a sufficiently low voltage relative to ½ VDD. In the case where the power supply voltage VDD decreases, the reference voltage Vref can be set around ½ VDD. Thus, even in the case where the power supply voltage VDD decreases, the reference voltage Vref does not fall more than necessary. Also when low level data is read, a reading margin for a sense amplifier can be obtained. Moreover, the dummy-bit-line voltage DBL is set between the ground voltage GND and the ½ VDD, thereby preventing deterioration of the digit disturb hold (DDH) characteristics of the memory cell coupled to the pair of bit lines that receive the dummy-bit-line voltage DBL. As in the related art, the bit lines are precharged at a voltage lower than ½ VDD, thereby improving the holding characteristics of high level data in the memory cell. Furthermore, the dummy-bit-line voltage is supplied in a data reading period and a charge is shared among the bit lines, thereby keeping the effect of increasing the speed of a circuit operation.

In the present embodiment, a charge is shared between the pairs (two pairs) of bit lines (D11-DB11, D12 DB12) in the first memory circuit 11-1 and between the pairs (two pairs) of bit lines (D21-DB21, D22-DB22) in the second memory circuit 11-2. However, a charge does not always need to be shared between the pairs of bit lines (D11-D1311, D12-DB12, D21-DB21, D22-DB22). For example, a charge may be shared between the pair of bit lines in the memory circuit 11-1 and the pair of bit lines in the memory circuit 11-2. Only one of the paired bit lines may be coupled to the reference voltage wiring 9 during the charge sharing. The number of bit lines coupled to the reference voltage wiring 9 may be adjusted to control the reference voltage Vref.

In the present embodiment, the dummy-bit-line voltage generating circuit 13 determines the dummy-bit-line voltage DBL according to the power supply voltage VDD. In this case, an off-leak current from the memory cell increases at a high temperature, and thus the reference voltage Vref is desirably set low at a high temperature. Hence, the dummy-bit-line voltage generating circuit 13 preferably determines the dummy-bit-line voltage DBL according to a temperature. Specifically, the dummy-bit-line voltage generating circuit 13 preferably determines the dummy-bit-line voltage DBL according to temperature measurement results obtained by a temperature sensor (not shown) such that the dummy-bit-line voltage DBL falls at a high temperature while the dummy-bit-line voltage DBL rises at a low temperature. Thus, the reference voltage Vref can be reduced at a high temperature, improving the holding characteristics of the memory cell.

The present embodiment described a data reading operation. Also in a data writing operation, the same operation after time t4 makes it possible to control the reference voltage Vref.

Second Embodiment

Figure 11:
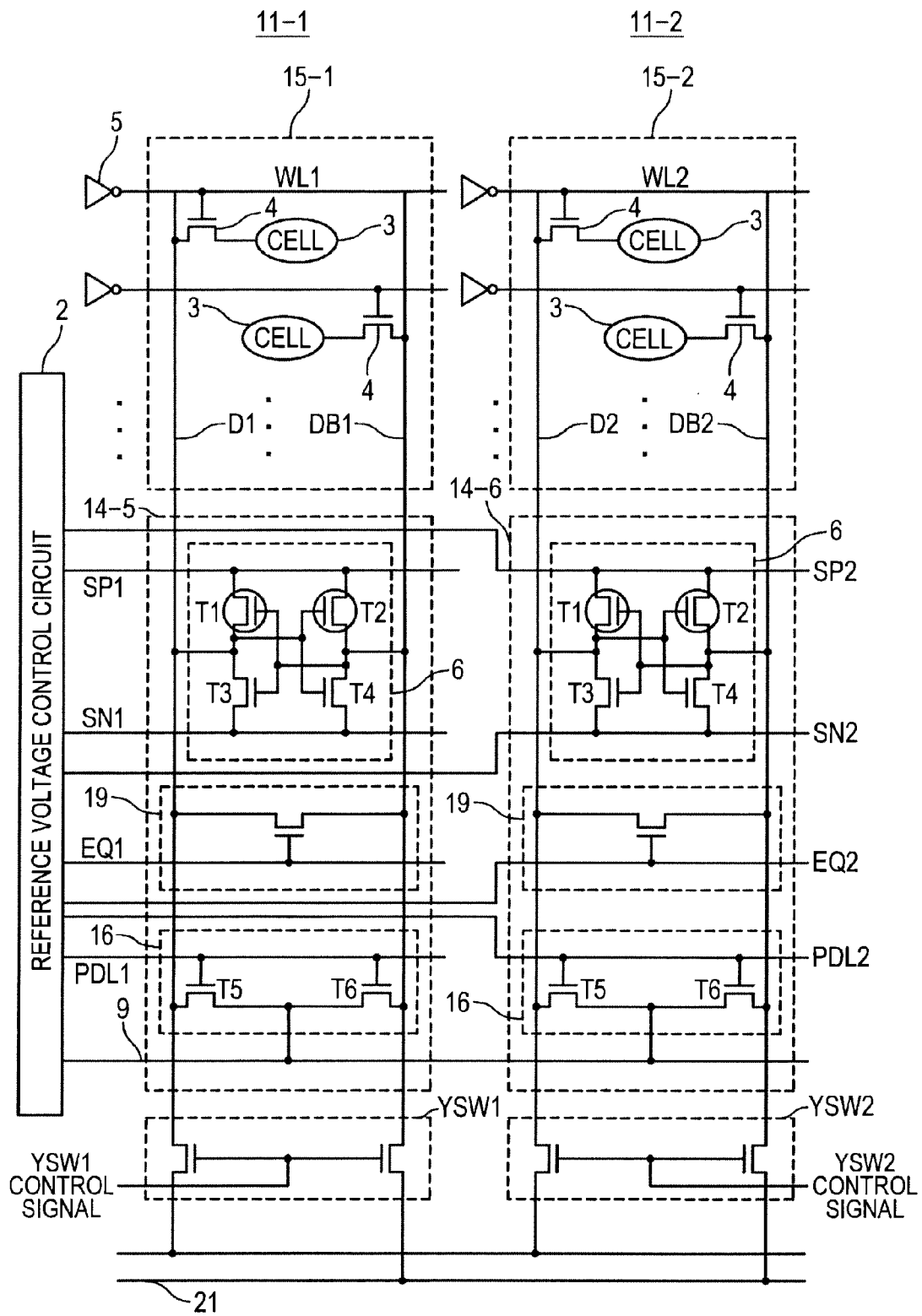
FIG. 11 is a schematic diagram illustrating a semiconductor memory according to a second embodiment.

A second embodiment will be described below. FIG. 11 is a schematic drawing illustrating a semiconductor memory 1 according to the present embodiment. FIG. 11 illustrates a first memory circuit 11-1, a second memory circuit 11-2, and a reference voltage control circuit 2. In the present embodiment, the reference voltage control circuit 2 does not include a dummy-bit-line voltage generating circuit 13 unlike in the first embodiment.

First, the configuration of the first memory circuit 11-1 will be described below. The first memory circuit 11-1 includes a pair of bit lines D1 and DB1, a cell plate 15-1, a sense amplifier area 14-5, and a Y switch circuit YSW1.

The cell plate 15-1 includes a plurality of capacitors 3 and a plurality of access transistors 4. The capacitor 3 is coupled to one of the bit lines (D1-DB1) via the access transistor 4. The access transistor 4 is controlled by one of word lines WL1. When the corresponding word line WL1 is selected, the capacitor 3 is coupled to one of the bit lines (D1-DB1). The word lines WL1 are selected by word line drivers 5.

The sense amplifier area 14-5 includes a sense amplifier circuit 6, an equalizer circuit 19, and a precharge circuit 16.

The sense amplifier circuit 6 includes PMOS transistors T1 and T2 and NMOS transistors T3 and T4. The common source of the PMOS transistors T1 and T2 is coupled to the reference voltage control circuit 2 to receive a control signal SP1. The common source of the NMOS transistors T3 and T4 is coupled to the reference voltage control circuit 2 to receive a control signal SN1. The sense amplifier circuit 6 amplifies a voltage difference between the paired bit lines (D1-DB1) when a high level signal is supplied as the control signal SP1 and a low level signal is supplied as the control signal SN1.

The equalizer circuit 19 is provided to short-circuit the pair of bit lines (D1-DB1). The equalizer circuit 19 is controlled by a control signal EQ1 so as to short-circuit the pair of bit lines (D1-DB1) when the control signal EQ1 is on (high level).

The precharge circuit 16 is provided to couple the pair of bit lines (D1-DB1) to the reference voltage wiring 9. The precharge circuit 16 includes transistors T5 and T6. The transistors T5 and T6 are coupled in series between the bit line D1 and the bit line DB1. A node between the transistor T5 and the transistor T6 is coupled to a reference voltage wiring 9. The gates of the transistors T5 and T6 are coupled to the reference voltage control circuit 2 (not shown) to receive a control signal PDL1.

The pair of bit lines (D1-DB1) is coupled to a data bus line 21 via the Y switch circuit YSW1. During reading or writing, the Y switch circuit YSW1 is turned on to read or write data through the data bus line 21.

The configuration of the second memory circuit 11-2 will be described below. The second memory circuit 11-2 is identical in configuration to the first memory circuit 11-1. Specifically, the second memory circuit 11-2 includes a pair of bit lines (D2-DB2), a cell plate 15-2, and a sense amplifier area 14-6.

The cell plate 15-2 includes a plurality of capacitors 3 and a plurality of access transistors 4. The capacitor 3 is coupled to one of the paired bit lines (D2-DB2) via the access transistor 4. The access transistors 4 are controlled by a plurality of word lines WL2.

The sense amplifier area 14-6 includes a sense amplifier circuit 6, an equalizer circuit 19, and a precharge circuit 16. In the sense amplifier circuit 6, the common source of PMOS transistors T1 and T2 is coupled to the reference voltage control circuit 2 to receive a control signal SP2. The common source of NMOS transistors T3 and T4 is coupled to the reference voltage control circuit 2 to receive a control signal SN2. The equalizer circuit 19 is controlled by a control signal EQ2. The equalizer circuit 19 short-circuits the pair of bit lines (D2-DB2) when the control signal EQ2 is on (high level). The precharge circuit 16 including transistors T5 and T6 is controlled by a control signal PDL2. The precharge circuit 16 couples the pair of bit lines (D2-DB2) to the reference voltage wiring 9 when the control signal PDL2 is on.

In the present embodiment, the control signals SP1, SN1, EQ1, PDL1, SP2, SN2, EQ2, and PDL2 are supplied by the reference voltage control circuit 2.

Figure 12:
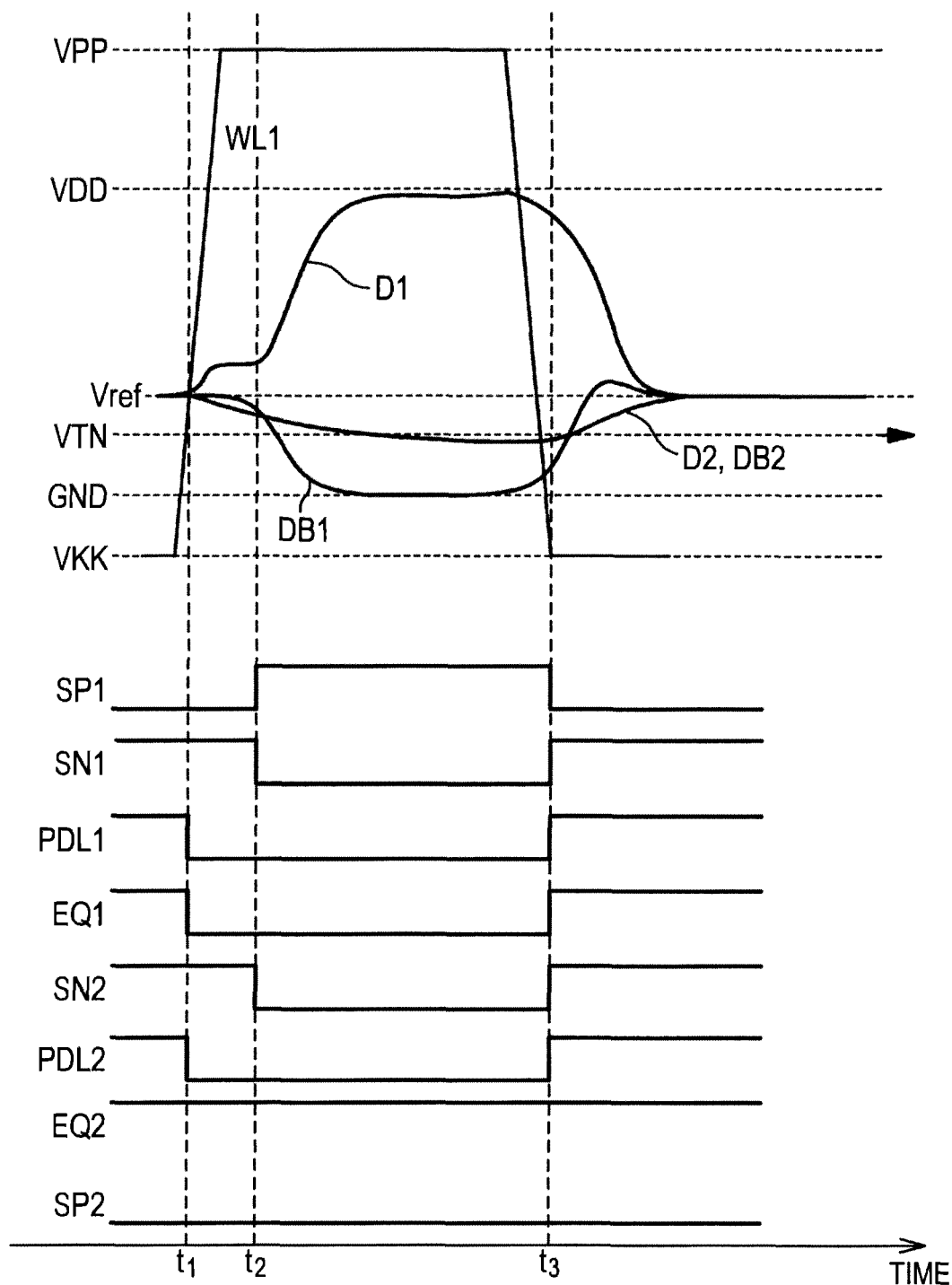
FIG. 12 is a timing chart showing a method of operating the semiconductor memory according to the second embodiment.

A method of operating the semiconductor memory 1 according to the present embodiment will be described below. FIG. 12 is a timing chart showing the method of operating the semiconductor memory 1 according to the present embodiment. FIG. 12 shows an operation of reading data from the first memory circuit 11-1, the potentials of the bit lines D1, DB1, D2, and DB2, and the waveforms of the control signals SP1, SN1, PDL1, EQ1, SN2, and PDL2. The control signal EQ2 is fixed at a high level while the control signal SP2 is fixed at a low level.

In FIG. 12, a period before time t1 is a standby period. In the standby period, the control signals SP1 and SP2 are low level signals while the control signal SN1, PDL1, EQ1, SN2, EQ2, and PDL2 are high level signals. In other words, during the standby period, the sense amplifier circuit 6 is not operated in each of the memory circuits 11. The pair of bit lines (D1-DB1, D2-DB2) is short-circuited by the equalizer circuit 19 in each of the memory circuits. The pair of bit lines (D1-DB1, D2-DB2) is coupled to the reference voltage wiring 9 via the precharge circuit 16 in each of the memory circuits. In other words, the pair of bit lines (D1-DB1, D2-DB2) has a reference voltage Vref in each of the memory circuits 11.

At time t1, the control signals PDL1, EQ1, and PDL2 are switched to a low level. The voltage of the word line WL1 is raised to VPP higher than a power supply voltage VDD to reliably turn on the access transistor 4. The control signals PDL1 and EQ1 are switched to the low level, thereby interrupting the pair of bit lines (D1-DB1) from the reference voltage wiring 9 in the first memory circuit 11-1. Furthermore, the bit lines D1 and DB1 are electrically cut off from each other. When the word line WL1 is selected, the capacitor 3 is coupled to the bit line D1. In the case where high level data is stored in the capacitor 3, the voltage of the bit line D1 slightly increases from the reference voltage Vref. Moreover, the control signal PDL2 is switched to the low level, interrupting the pair of bit lines (D2-DB2) from the reference voltage wiring 9 in the second memory circuit 11-2. The supply of a high level signal to the control signal EQ2 is continued, leading to a short circuit between the pair of bit lines D2-DB2.

After that, at time t2, the control signal SP1 is switched to a high level, the control signal SN1 is switched to a low level, and the control signal SN2 is switched to a low level. Thus, in the first memory circuit 11-1, the sense amplifier circuit 6 is driven to amplify a voltage difference between the paired bit lines (D1-DB1). Specifically, the voltage of the bit line D1 is raised to the power supply voltage VDD while the voltage of the bit line DB1 is lowered to a ground voltage GND.

Since data is not read from the second memory circuit 11-2, the supply of a low level signal as the control signal SP2 is continued. At time t2, a low level signal is supplied as the control signal SN2. Consequently, the voltage of the pair of bit lines (D2, DB2) changes to a threshold voltage VTN of the transistors T3 and T4. This point will be described below.

Figure 13:
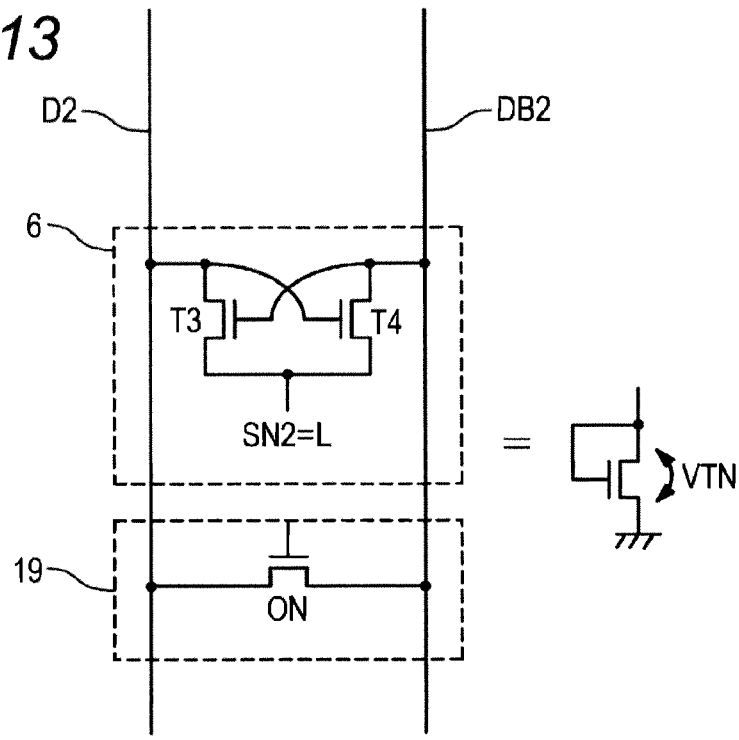
FIG. 13 is an equivalent circuit diagram of a sense amplifier circuit.

FIG. 13 shows an equivalent circuit of the sense amplifier circuit 6 in the case where low level signals are supplied as the control signals SP2 and SN2. As shown in FIG. 13, when the control signals SP2 and SN2 are set at a low level, the PMOS transistors T1 and T2 are turned off. Hence, in the sense amplifier circuit 6, the NMOS transistors T3 and T4 are diode-connected between a ground voltage (control signal SN2=low level) and the pair of bit lines (D2-DB2). In this case, the pair of bit lines (D2-DB2) is short-circuited by the equalizer circuit 19. Thus, the voltage of the pair of bit lines (D2-DB2) is changed to the threshold voltage VTN of the NMOS transistors T3 and T4.

After that, as shown in FIG. 12, the voltage of the word line WL1 is reduced to a low level at time t3. Moreover, the control signal SP1 is switched to a low level while the control signals SN1, PDL1, EQ1, SN2, and PDL2 are switched to a high level. Consequently, as in the foregoing embodiment, the pair of hit lines (D1 DB1) in the first memory circuit 11-2 and the pair of hit lines (D2-DB2) in the second memory circuit 11-2 are coupled to each other via the reference voltage wiring 9. As in the foregoing embodiment, a charge is shared among the hit lines (D1, DB1, D2, DB2).

In the present embodiment, data is read in the selected memory circuit (first memory circuit 11-1); meanwhile, the voltage (hereinafter, will be called a dummy bit-line level DBL) of the pair of bit lines (D2-DB2) in the unselected memory circuit (second memory circuit 11-1) is controlled to the threshold voltage VTN of the NMOS transistors (T3, T4). In other words, the dummy bit-line level DBL is the threshold voltage VTN. Hence, the same effect can be obtained as in the foregoing embodiment.

Figure 14:
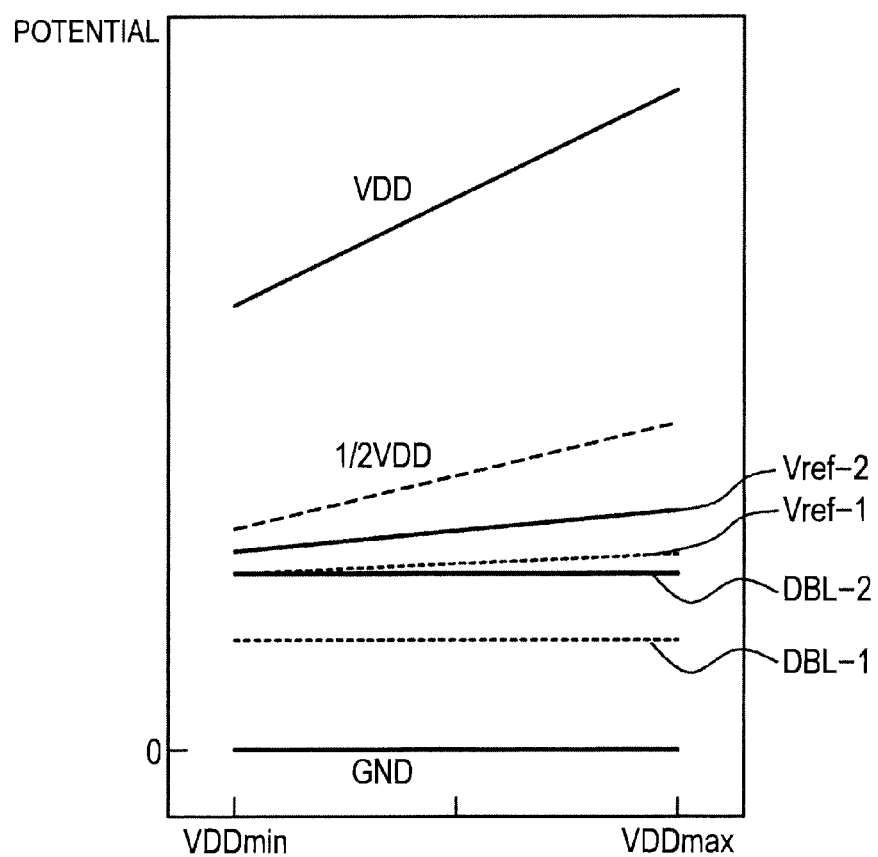
FIG. 14 is a graph showing the relationship among a power supply voltage VDD, a dummy-bit-line level, and a reference voltage.

The threshold voltage VTN of the NMOS transistor (T3, T4) depends on a temperature. Specifically, the threshold voltage VTN and the dummy bit-line level DBL are lowered at a high temperature, and thus the reference voltage Vref can be properly controlled according to a temperature. FIG. 14 shows the relationship among the power supply voltage VDD, a dummy bit-line level (DBL-1, DBL-2), and a reference voltage (Vref-1, Vref-2). The dummy bit-line level DBL-1 and the reference voltage Vref-1 respectively indicate the dummy bit-line level DBL and a reference voltage Vref at a high temperature. The dummy bit-line level DBL-2 and the reference voltage Vref-2 respectively indicate a dummy bit-line level DBL and a reference voltage Vref at a low temperature. As shown in FIG. 14, the threshold voltage VTN of the NMOS transistor (T3, T4) decreases at a high temperature more than at a low temperature. Hence, the dummy bit-line level DBL-1 at a high temperature is lower than the dummy bit-line level DBL-2 at a low temperature, causing the reference voltage Vref-1 at a high temperature to be lower than the reference voltage Vref-2 at a low temperature. As described above, an off-leakage current from the memory cell also increases at a high temperature. Thus, the reference voltage Vref is desirably set at a low value at a high temperature. According to the present embodiment, the dummy bit-line level DBL is controlled to the threshold voltage VTN of the NMOS transistor (T3, T4), thereby controlling the reference voltage Vref to a low potential at a high temperature with improved cell hold characteristics.

Moreover, the present embodiment is different from the first embodiment in that the reference voltage control circuit 2 does not need the dummy-bit-line voltage generating circuit 13 (FIG. 7) for controlling the dummy bit-line level DBL. Furthermore, the memory circuit 11 does not include the dummy-bit-line level switching circuit 17 (FIG. 7). Thus, the circuit configuration can be more simplified than in the first embodiment.

Figure 15:
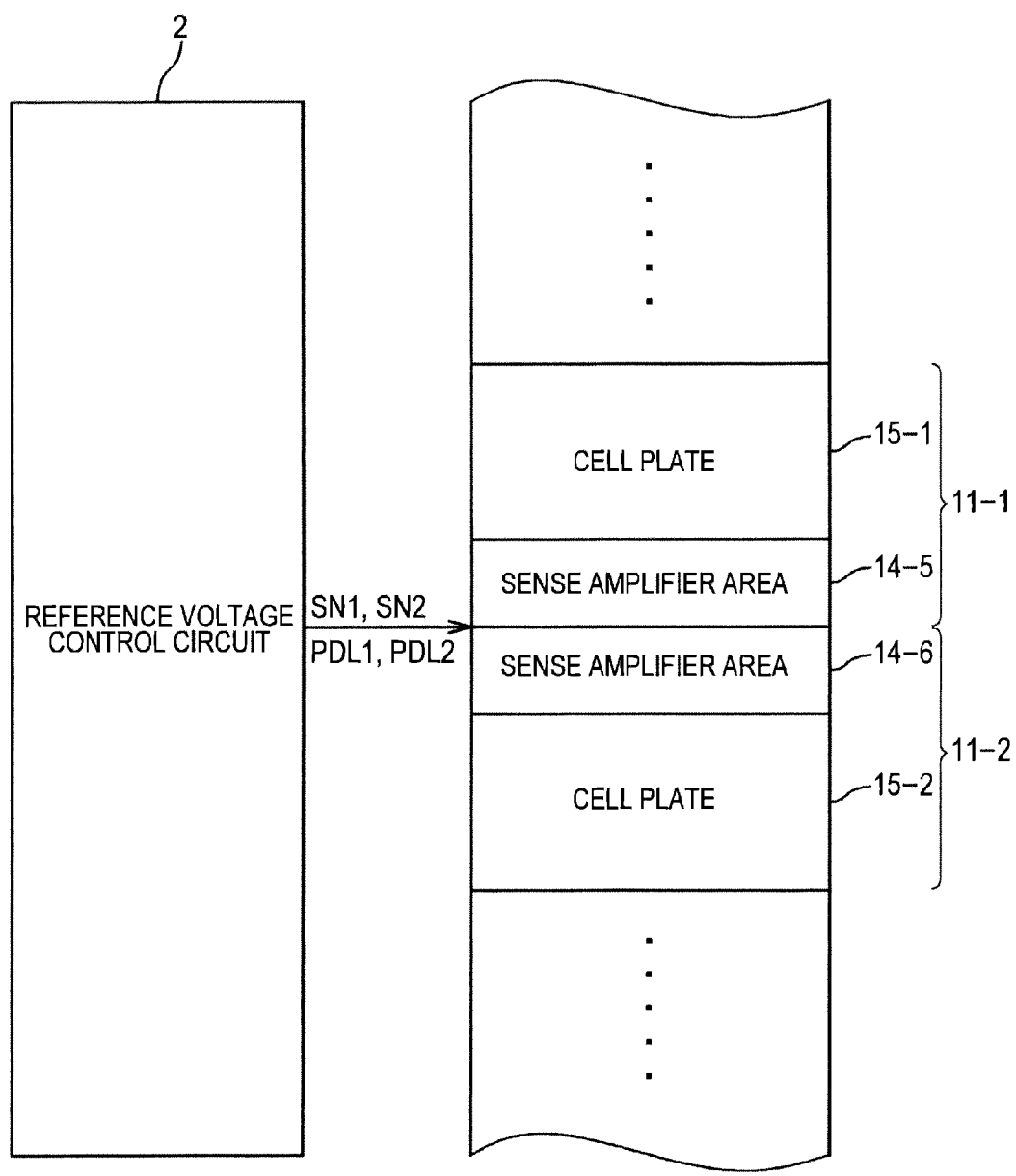
FIG. 15 is a schematic diagram illustrating an example of the layout of a first memory circuit and a second memory circuit.

In the present embodiment, the first memory circuit 11-1 and the second memory circuit 11-2 are arranged to further simplify the circuit configuration. FIG. 15 is a schematic diagram showing an example of the layout of the first memory circuit 11-1 and the second memory circuit 11-2. In the example of FIG. 15, the first memory circuit 11-1 and the second memory circuit 11-2 are adjacent to each other. The sense amplifier area 14-5 in the first memory circuit 11-1 is disposed between the cell plate 15-1 and the second memory circuit 11-2. The sense amplifier area 14-6 in the second memory circuit 11-2 is disposed between the cell plate 15-2 and the first memory circuit 11-1. In other words, the sense amplifier areas 14 of the first memory circuit 11-1 and the second memory circuit 11-2 are adjacent to each other.

As shown in FIG. 12, the control signal SN1 and the control signal SN2 are signals of the same level all that time. The control signals PDL2 and PDL1 are also signals of the same level. The first memory circuit 11-1 and the second memory circuit 11-2 are arranged such that the sense amplifier areas 14 are adjacent to each other, allowing the supply of the control signal SN1 to the sense amplifier area 14-5 and the supply of the control signal SN2 to the sense amplifier area 14-6 through a common wire. Similarly, through a common wire, the control signal PDL1 can be supplied to the sense amplifier area 14-5, and the control signal PDL2 can be supplied to the sense amplifier area 14-6. Thus, the number of wires required for the control signals can be reduced so as to simplify the circuit configuration.

Third Embodiment

A third embodiment will be described below. In the foregoing embodiments, a charge is shared between the pair of bit lines of the first memory circuit 11-1 and the pair of bit lines of the second memory circuit 11-2 to determine the level of the reference voltage Vref, whereas in the present embodiment, a single memory circuit determines the level of a reference voltage Vref.

Figure 16:
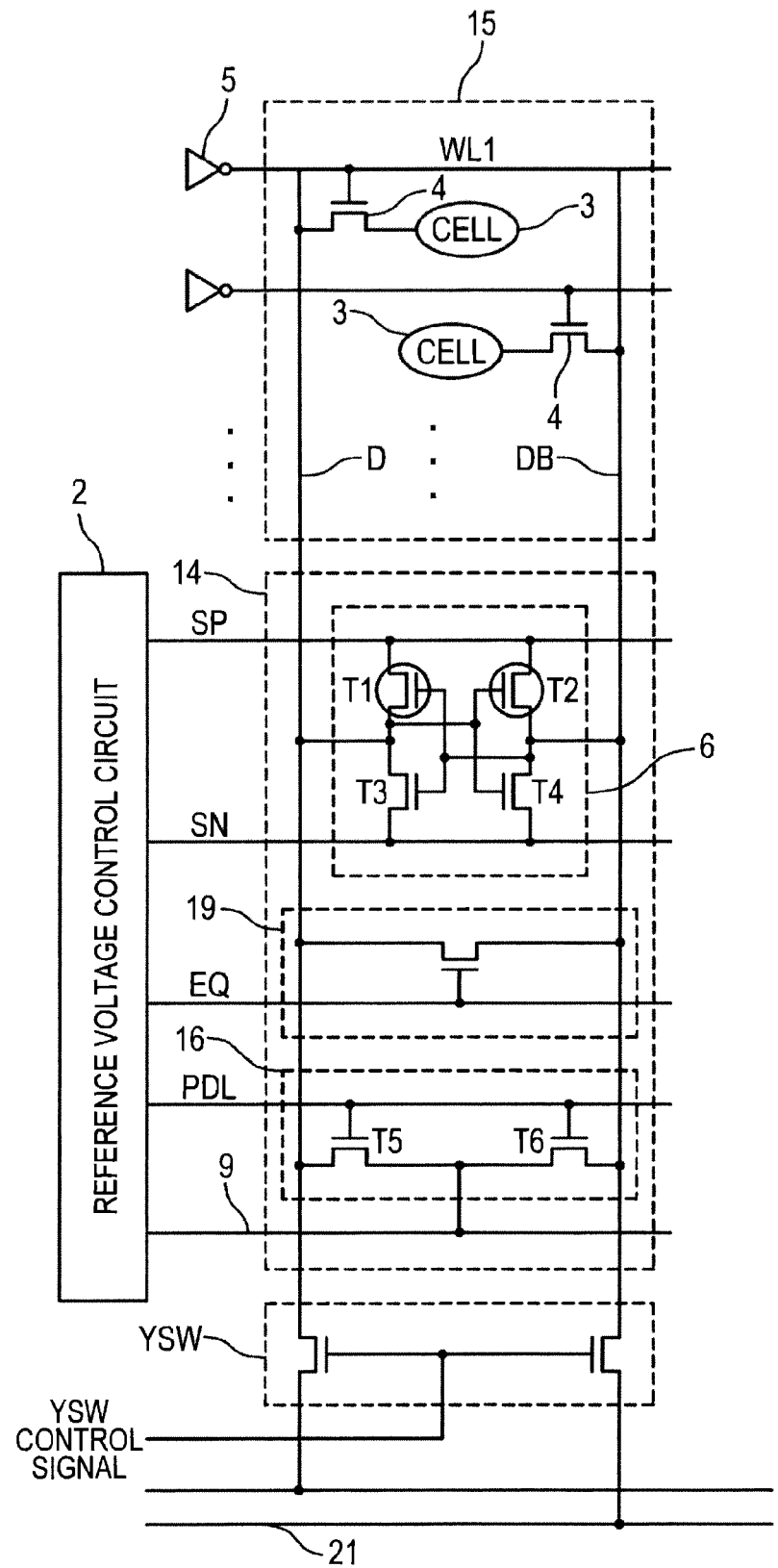
FIG. 16 is a schematic diagram illustrating the configuration of a memory circuit in a semiconductor memory according to a third embodiment.

FIG. 16 is a schematic diagram illustrating the configuration of a memory circuit 11 in a semiconductor memory 1 according to the present embodiment. The memory circuit 11 according to the present embodiment is identical in configuration to the memory circuit 11 (11-1, 11-2) of the second embodiment. Specifically, the memory circuit 11 includes a plurality of capacitors 3, a pair of bit lines (D-DB), a cell plate 15, and a sense amplifier area 14. The capacitors 3 are each coupled to one of the paired bit lines (D-DB) via the access transistor 4. The access transistor 4 is turned on when the corresponding word line is selected. The sense amplifier area 14 includes a sense amplifier circuit 6, an equalizer circuit 19, and a precharge circuit 16. The sense amplifier circuit 6 is controlled by control signals SP and SN. The equalizer circuit 19 is controlled by a control signal EQ and short-circuits the pair of bit lines (D-DB). The precharge circuit 16 is controlled by a control signal PDL and couples the pair of bit lines (D-DB) to the reference voltage wiring 9. The pair of bit lines (D-DB) is coupled to a data bus line 21 via a switch circuit YSW.

The control signals SP, SN, PDL, and EQ are supplied by a reference voltage control circuit 2.

Figure 17:
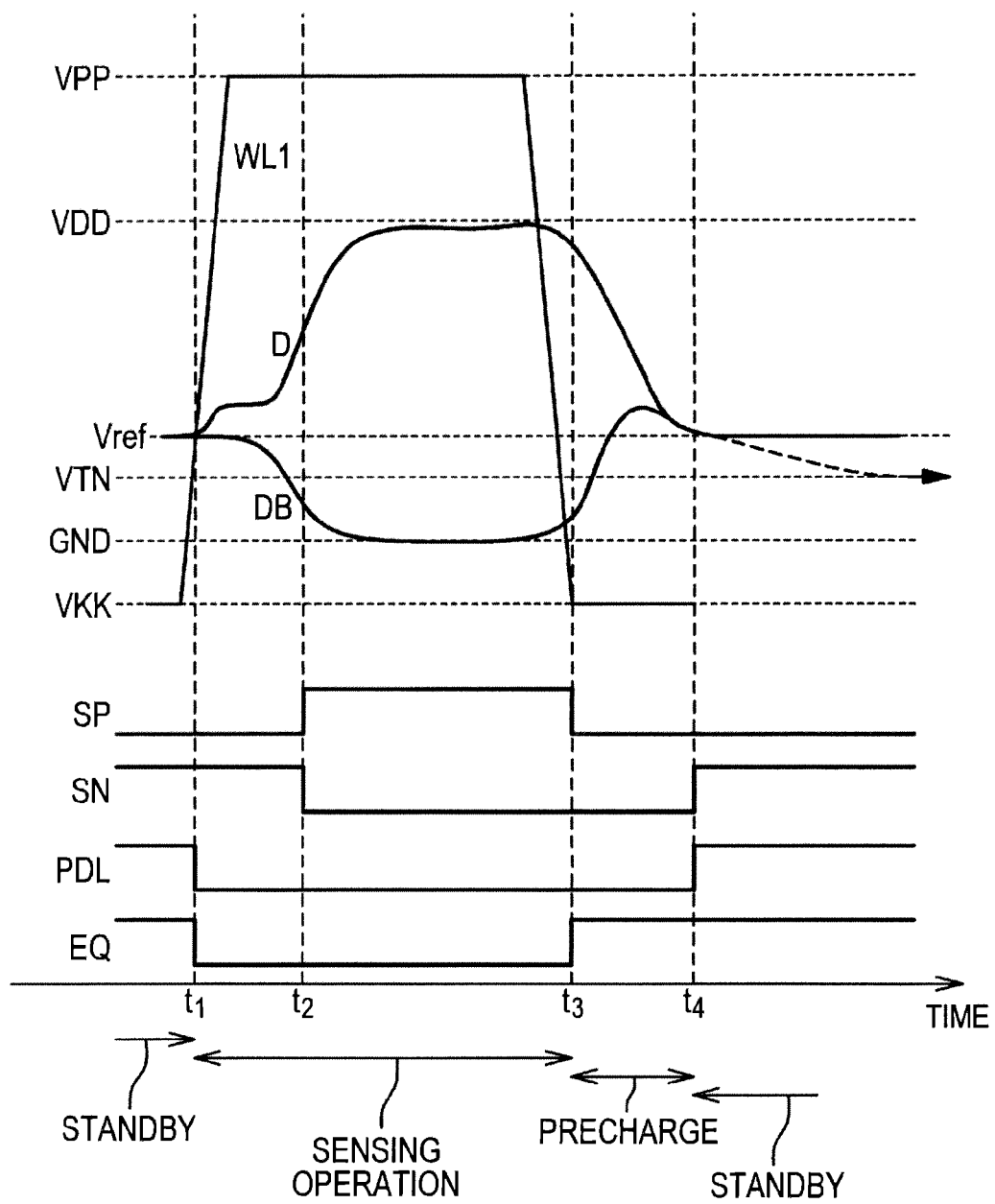
FIG. 17 is a timing chart showing a method of operating the semiconductor memory.

FIG. 17 is a timing chart showing a method of operating the semiconductor memory 1. FIG. 17 shows the waveforms of the pair of bit lines (D-DB) and the waveforms of the control signals SP, SN, PDL, and EQ. In FIG. 17, a period before time t1 is a standby period. A period from time t1 to time t3 is a reading period (sensing operation period). A period from time t3 to time t4 is a precharge period. A period after time t4 is a standby period.

Before time t1, the control signal SP is supplied as a low level signal while high level signals are supplied as the control signals SN, PDL, and EQ. At this point, the pair of bit lines (D-DB) is short-circuited and coupled to a reference voltage wiring 9. In other words, the voltage of the pair of bit lines (D-DB) is controlled to the reference voltage Vref.

At time t1, a word line WL1 is selected, and the control signals PDL and EQ are changed to a low level. The control signals PDL and EQ at the low level isolate the pair of bit lines (D-DB) from the reference voltage wiring 9. The paired bit lines (D-DB) are shut off from each other. When the word line WL1 is selected, the capacitor 3 is coupled to the bit line D. In the case where high level data is stored in the capacitor 3, the voltage of the bit line D slightly increases from the reference voltage Vref.

At time t2, the control signal SP is switched to a high level, and the control signal SN switched to a low level. Thus, the sense amplifier circuit 6 is operated to amplify a voltage difference between the paired bit lines (D-DB). Specifically, the voltage of the bit line D is raised to a power supply voltage VDD while the potential of the bit line DB is lowered to a ground voltage GND.

At time t3, the voltage of the word line WL1 is lowered to the ground voltage, the control signal SP is switched to a low level, and the control signal EQ is switched to a high level. Thus, as in the second embodiment, NMOS transistors (T3, T4) are diode-connected between the paired bit lines (D-DB) and the ground voltage GND in the sense amplifier circuit 6, allowing the voltage of the pair of bit lines (D-DB) to temporarily approach ½ VDD and then drop to a threshold voltage VTN of the NMOS transistors T3 and T4.

At time t4, the control signals SN and PDL are switched to a high level. Thus, the pair of bit lines (D-DB) is coupled to the reference voltage wiring 9, and the voltage of the pair of bit lines (D-DB) is fixed at the reference voltage Vref. In the case of a long precharge period (a period from time t3 to time t4), the reference voltage Vref decreases (close to the threshold voltage VTN). In the case of a short precharge period, the reference voltage Vref is high. Thus, the reference voltage control circuit 2 includes a delay circuit that controls the duration of the precharge period, enabling setting of the reference voltage Vref to a proper voltage. The setting of the reference voltage Vref supplied from the reference voltage control circuit 2 may be similarly adjusted.

The present embodiment requires the precharge period after the sensing operation period but makes it possible to set the reference voltage Vref at a proper voltage without providing a dummy-bit-line voltage generating circuit 13 (FIG. 7) in the reference voltage control circuit 2. Thus, even if the power supply voltage VDD fluctuates, a reduction in reading margin can be prevented.

In the case where the reference voltage Vref is controlled to the threshold voltage VTN, an NMOS transistor as large as the NMOS transistor (T3, T4) is preferably used as a reference voltage generating circuit 12 that supplies the reference voltage Vref to the reference voltage wiring 9. The NMOS transistor makes it possible to correctly match the reference voltage Vref supplied to the reference voltage wiring 9 with the threshold voltage VTN of the NMOS transistor (T3, T4).

The first to third embodiments have been described above according to the present invention. These embodiments are not independent from one another and thus may be combined as long as no inconsistencies are found.

What is claimed is:

1. A semiconductor memory comprising:
   a reference voltage control circuit containing a reference voltage generating circuit that generates a reference voltage;
   a first memory circuit including: a first memory cell coupled to a first word line; a first bit line pair where data stored in the first memory cell is read; a first precharge circuit that couples the reference voltage generating circuit with the first bit line pair to precharge the first bit line pair to the reference voltage; a first equalizer circuit that equalizes the first bit line pair; and a first sense amplifier that is coupled to the first bit line pair to amplify a voltage difference of the first bit line pair during activation;
   a second memory circuit including: a second memory cell coupled to a second word line; a second bit line pair where data stored in the second memory cell is read; a second precharge circuit that couples the reference voltage generating circuit with the second bit line pair to precharge the second bit line pair to the reference voltage; a second equalizer circuit that equalizes the second bit line pair; and a second sense amplifier that is coupled to the second bit line pair to amplify a voltage difference of the second bit line pair during activation,
   wherein the second bit line pair is set at a dummy-bit-line voltage ranging from a ground voltage to $\frac{1}{2} \times$VDD in a reading/writing period during which the first memory circuit is selected and the second memory circuit is unselected, and
   wherein the first and second precharge circuits couple the first and second bit line pairs to the reference voltage generating circuit in a precharge period after the reading/writing period;
   a dummy-bit-line voltage generating circuit that generates the dummy-bit-line voltage, the dummy-bit-line voltage generating circuit generating the dummy-bit-line voltage fluctuating with a power supply voltage,
   wherein the dummy-bit-line voltage generating circuit determines the dummy-bit-line voltage according to a relation where the lower the VDD, the higher the dummy-bit-line voltage and vice versa; and
   a dummy-bit-line level switching circuit, which couples the second bit line pair to the dummy-bit-line voltage generating circuit to apply the dummy-bit-line voltage to the second bit line pair in the reading/writing period during which the first memory circuit is selected and the second memory circuit is unselected.

2. The semiconductor memory according to claim 1,
   wherein the second sense amplifier circuit includes: first and second PMOS transistors whose sources are fed with a first sense amplifier control signal, and first and second NMOS transistors whose sources are fed with a second sense amplifier control signal, the first and second NMOS transistors being coupled to the respective first and second PMOS transistors, and
   wherein the dummy-bit-line voltage is supplied to the second bit line pair by deactivating the first sense amplifier control signal of the second sense amplifier circuit, activating the second sense amplifier control signal, and activating the second equalizer circuit in the reading/writing period.

3. The semiconductor memory according to claim 1, wherein the dummy-bit-line voltage generating circuit determines the dummy-bit-line voltage according to a relation where the reference voltage decreases at a high temperature whereas the reference voltage increases at a low temperature.

4. A method of operating a semiconductor memory, the semiconductor memory including: a dummy-bit-line level switching circuit; a reference voltage control circuit containing a reference voltage generating circuit that generates a reference voltage; a first memory circuit including: a first memory cell coupled to a first word line; a first bit line pair where data stored in the first memory cell is read; a first precharge circuit that couples the reference voltage generating circuit with the first bit line pair to precharge the first bit line pair to the reference voltage; a first equalizer circuit that equalizes the first bit line pair; and a first sense amplifier that is coupled to the first bit line pair to amplify a voltage difference of the first bit line pair during activation; and a second memory circuit including: a second memory cell coupled to a second word line; a second bit line pair where data stored in the second memory cell is read; a second precharge circuit that couples the reference voltage generating circuit with the second bit line pair to precharge the second bit line pair to the reference voltage; a second equalizer circuit that equalizes the second bit line pair; and a second sense amplifier that is coupled to the second hit line pair to amplify a voltage difference of the second bit line pair during activation,
   the method comprising the steps of:
   controlling the second bit line pair to a dummy-bit-line voltage ranging from a ground voltage to $\frac{1}{2} \times$VDD in a reading/writing period during which the first memory circuit is selected and the second memory circuit is unselected;
   coupling the first and second bit line pairs to the reference voltage generating circuit via the first and second precharge circuits in a precharge period after the reading/writing period; and
   a step of generating the dummy-bit-line voltage,
   wherein the step of generating the dummy-bit-line voltage includes the step of generating the dummy-bit-line voltage varying with a power supply voltage,
   wherein the step of generating the dummy-bit-line voltage includes the step of determining the dummy-bit-line voltage according to a relation where the lower the power supply voltage VDD, the higher the dummy-bit-line voltage and vice versa, and
   wherein the step of controlling the second bit line pair to a dummy-bit-line voltage includes coupling the second bit line pair to the dummy-bit-line voltage via the dummy-bit-line level switching circuit.

5. The method of operating a semiconductor memory according to claim 4,
   wherein the second sense amplifier circuit includes: first and second PMOS transistors whose sources are fed with a first sense amplifier control signal, and first and second NMOS transistors whose sources are fed with a second sense amplifier control signal, the first and second NMOS transistors being coupled to the respective first and second PMOS transistors, and
   wherein the step of controlling the second bit line pair to the dummy-bit-line voltage includes the step of controlling the second bit line pair to the dummy-bit-line voltage by deactivating the first sense amplifier control signal of the second sense amplifier circuit, activating the second sense amplifier control signal, and activating the second equalizer circuit in the reading/writing period.

6. The method of operating a semiconductor memory according to claim 5, wherein the step of generating the dummy-bit-line voltage includes the step of determining the dummy-bit-line voltage according to a relation where the reference voltage decreases at a high temperature whereas the reference voltage increases at a low temperature.

* * * * *